(12) United States Patent
Tanzawa et al.

(10) Patent No.: US 6,487,120 B2
(45) Date of Patent: Nov. 26, 2002

(54) BOOSTED VOLTAGE GENERATING CIRCUIT AND SEMICONDUCTOR MEMORY DEVICE HAVING THE SAME

(75) Inventors: Toru Tanzawa, Ebina (JP); Takeshi Miyaba, Yokohama (JP); Shigeru Atsumi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/864,181

(22) Filed: May 25, 2001

(65) Prior Publication Data
US 2002/0003724 A1 Jan. 10, 2002

(30) Foreign Application Priority Data
May 25, 2000 (JP) .......................... 2000-154983

(51) Int. Cl.[7] .............................................. G11C 16/04
(52) U.S. Cl. ............................ 365/185.18; 365/185.27; 365/185.33
(58) Field of Search ..................... 365/226, 189.09, 365/189.11, 185.18, 185.27, 185.33

(56) References Cited

U.S. PATENT DOCUMENTS

| | | | |
|---|---|---|---|
| 5,483,486 A | 1/1996 | Javanifard et al. ..... | 365/185.17 |
| 5,726,944 A | * 3/1998 | Pelly, III et al. ............ | 365/226 |
| 5,982,695 A | * 11/1999 | Mukai ........................ | 365/226 |
| 6,041,012 A | 3/2000 | Banba et al. .......... | 365/185.18 |
| 6,327,194 B1 | * 12/2001 | Kurihara et al. ............ | 365/226 |
| 6,356,499 B1 | * 3/2002 | Banba et al. ............... | 365/226 |

FOREIGN PATENT DOCUMENTS

| | | |
|---|---|---|
| JP | 10-11987 | 1/1998 |
| JP | 10-302492 | 11/1998 |

* cited by examiner

*Primary Examiner*—Trong Phan
(74) *Attorney, Agent, or Firm*—Banner & Witcoff, Ltd.

(57) ABSTRACT

There are provided a boosted voltage generating circuit and a semiconductor memory device having the boosted voltage generating circuit which includes a booster circuit for outputting high voltage obtained by boosting the power supply voltage, a regulator circuit supplied with the high voltage, for generating voltage whose voltage value is smaller than the value of the high voltage and which is variably set to at least two values based on the high voltage at the operating time, and a equalizer circuit connected to the booster circuit and regulator circuit, for short-circuiting an output node of the booster circuit and an output node of the regulator circuit in response to a first control signal, wherein the operative period of the regulator circuit and the short-circuiting operation period of the equalizer circuit do not overlap each other.

19 Claims, 10 Drawing Sheets

BOOSTED VOLTAGE GENERATING CIRCUIT AND SEMICONDUCTOR MEMORY DEVICE HAVING THE SAME

CROSS-REFERENCE TO RELATED APPLICATIONS

This application is based upon and claims the benefit of priority from the prior Japanese Patent Application No. 2000-154983, filed May 25, 2000, the entire contents of which are incorporated herein by reference.

BACKGROUND OF THE INVENTION

This invention relates to a boosted voltage generating circuit for boosting power supply voltage and a semiconductor memory device having the same and more particularly to a semiconductor memory device having memory cells and a boosted voltage generating circuit for generating high voltage used at the data erasing or programming time of the memory cell.

A flash memory is provided as one type of a semiconductor memory device. FIG. 1 shows the cross sectional construction of one memory cell element of the flash memory. In FIG. 1, an N-type well region (N-well) 72 is formed in a P-type semiconductor substrate (P-substrate) 71. Further, a P-type well region (P-well) 73 is formed in the N-type well region 72. In the P-type well region 73, source and drain regions 74, 75 of a memory cell which are formed of $n^+$-type regions are separately formed. A floating gate electrode 76 is formed above the channel region between the source and drain regions 74 and 75 with an insulating film disposed therebetween and a control gate electrode 77 is formed above the floating gate electrode 76 with an insulating film disposed therebetween.

Further, a contact region 78 formed of a $p^+$-type region is formed on the P-substrate 71, a contact region 79 formed of an $n^+$-type region is formed on the N-type well region 72 and a contact region 80 formed of a $p^+$-type region is formed on the P-type well region 73.

At the operating time, gate voltage Vg, drain voltage Vd and source voltage Vs are respectively applied to the control gate electrode 77, drain region 75 and source region 74. Further, the same voltage as the source voltage Vs is applied to the contact regions 79 and 80 and a ground voltage of 0V is applied to the contact region 78.

The above memory cell stores data of "1" or "0" level according to the amount of electrons accumulated in the floating gate electrode 76. The threshold voltage as viewed from the control gate electrode 77 is changed according to the level of the stored data.

A memory cell array is constructed by use of a plurality of memory cells which have the same construction as the above memory cell. FIG. 2 shows an example of a circuit of the memory cell array of a NOR type flash memory. A plurality of memory cells MC are arranged in a matrix form and the control gate electrodes of the memory cells MC arranged on the same row are commonly connected to a corresponding one of a plurality of word lines WL0 to WLn. Further, the drains of the memory cells MC arranged on the same column are commonly connected to a corresponding one of a plurality of bit lines BL0 to BLm. Generally, the memory cells are divided into a plurality of blocks and the sources of the memory cells MC in the same block are commonly connected to a corresponding one of a plurality of source lines SLi which is provided for the block.

FIG. 3 shows the relation between the gate voltage (Vg) applied to the control gate electrode and a drain current flowing in the memory cell at the operating time. In this example, the state in which the amount of electrons accumulated in the floating gate electrode is relatively large, that is, the state in which the threshold voltage Vt of the memory cell is high is defined as "0" data (the memory cell storing "0" data is referred to as a "0" cell) and the state in which the amount of accumulated electrons is relatively small, that is, the state in which the threshold voltage Vt of the memory cell is low is defined as "1" data (the memory cell storing "1" data is referred to as a "1" cell).

One example of the voltage bias condition at the data readout time, program time and erase time is shown in the following table 1.

TABLE 1

|    | Readout | Program        | Erase    |
|----|---------|----------------|----------|
| Vg | 5 V     | 9 V            | −7 V     |
| Vd | 1 V     | 5 V("1")       | Floating |
|    |         | 0 V("0")       |          |
| Vs | 0 V     | 0 V            | 10 V     |

That is, the table 1 shows one example of values of the voltages Vg, Vd, Vs supplied to the memory cell. At the data readout time, Vg, Vd, Vs are respectively set at 5V, 1V, 0V. At the data program time, Vg, Vs are respectively set at 9V, 0V and Vd is set at 5V for the memory cell into which data is programmed and at 0V for the other memory cells (in which original "1" data is kept). Further, at the data erase time, Vg, Vs are respectively set at −7V, 10V and Vd is set in the electrically floating state.

Readout data is determined according to whether a cell current flows or not when voltage Vread (in this example, 5V) is applied to the control gate electrode while preset voltage (in this example, 1V) is being applied to the drain. The above determination is made by comparing the cell current with a reference current (Iref) flowing in a reference cell by use of a sense amplifier (not shown).

The erase operation is simultaneously effected for a plurality of memory cells which commonly have the P-well 73 (shown in FIG. 1). At the erase time, all of the memory cells subjected to the erase process are set into "1" cells by causing electrons to flow from the floating gate electrodes 76 thereof into the P-type well region 73 according to the Fowler-Nordheim (F•N) tunneling phenomenon.

The program operation is effected for each memory cell. The bit line connected to the memory cell in which "0" data is programmed is biased to 5V so as to inject electrons of high energy generated by the channel hot electron phenomenon into the floating gate electrode 76 of the memory cell. The bit line connected to the "1" cells in which original "1" data is maintained is set at 0V. As a result, no electrons are injected into the floating gate electrode 76 and the threshold voltage Vt is kept unchanged in the non-programmed memory cell.

Further, in the flash memory, the program verify operation and erase verify operation are effected at the program time and erase time to confirm the extent to which data is programmed and erased. In the program verify operation, the "0" readout operation is effected by setting the voltage of the control gate electrode at high voltage Vpv (for example, 7V) in comparison with the voltage Vread (in this example, 5V) set at the readout time. Then, the program operations and program verify operations are repeatedly and alternately effected and the program operation is terminated when data items of the memory cells to be programmed are all set to "0".

At the erase time, the "1" readout operation is effected by setting the voltage of the control gate electrode 77 at low voltage Vev (for example, 3.5V) in comparison with the voltage Vread set at the readout time. Then, the erase operations and erase verify operations are repeatedly and alternately effected and the erase operation is terminated when data items of the memory cells subjected to the erase process are all set to "1". As a result, a sufficiently large cell current Icell can be attained.

Thus, the voltage applied to the control gate electrode of the memory cell is set to various values such as 9V, 7V, 5V, 3.5v according to the various operation modes. Among the above voltages, 9V, 7V, 5V are higher than the power supply voltage supplied from the exterior.

Conventionally, in order to generate various voltages such as 9V, 7V, 5V which are higher than the power supply voltage supplied from the exterior, a required number of booster circuits for boosting the power supply voltage are provided and one of the outputs of the plurality of booster circuits is adequately selected by use of a switch and the selected output is applied to the control gate electrode of the memory cell.

However, since the booster circuit necessitates elements such as capacitors which occupy a large area on the chip, there occurs a problem that the chip area becomes large if a plurality of booster circuits are provided. Further, since the consumption current in the booster circuit is relatively large, a problem that the consumption current in the whole portion of the chip becomes large occurs.

BRIEF SUMMARY OF THE INVENTION

As described above, since a plurality of booster circuits are provided in the conventional semiconductor memory device which requires various voltages higher than the power supply voltage supplied from the exterior, problems that the chip area becomes large at the time of integrating the device and the consumption current becomes large occur.

Accordingly, an object of this invention is to provide a boosted voltage generating circuit capable of generating various voltages higher than the power supply voltage supplied from the exterior without making the chip area larger at the time of integration and increasing the consumption current.

Further, another object of this invention is to provide a semiconductor memory device capable of generating various voltages higher than the power supply voltage supplied from the exterior without making the chip area larger at the time of integration and increasing the consumption current.

According to this invention, there is provided a boosted voltage generating circuit comprising a first voltage output circuit for receiving first voltage and outputting second voltage obtained by boosting the first voltage; a second voltage output circuit coupled with the first voltage output circuit, for generating third voltage whose voltage value is smaller than the value of the second voltage and which is variably set to at least two values based on the second voltage; and an equalizer circuit coupled with the first and second voltage output circuits, for short-circuiting an output node of the second voltage and an output node of the third voltage in response to a first control signal.

Further, according to this invention, there is provided a semiconductor memory device comprising a memory cell array having a plurality of data-erasable memory cells having gate electrodes, for storing data; a plurality of word lines coupled with the gate electrodes of the plurality of memory cells; a first voltage output circuit for receiving first voltage and outputting second voltage obtained by boosting the first voltage; a second voltage output circuit coupled with the first voltage output circuit, for generating third voltage whose voltage value is smaller than the value of the second voltage and which is variably set to at least two values based on the second voltage; a equalizer circuit coupled with the first and second voltage output circuits, for short-circuiting an output node of the second voltage and an output node of the third voltage in response to a first control signal; and a row decoder circuit coupled with the second voltage output circuit, for setting potentials of the plurality of word lines based on the third voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4:
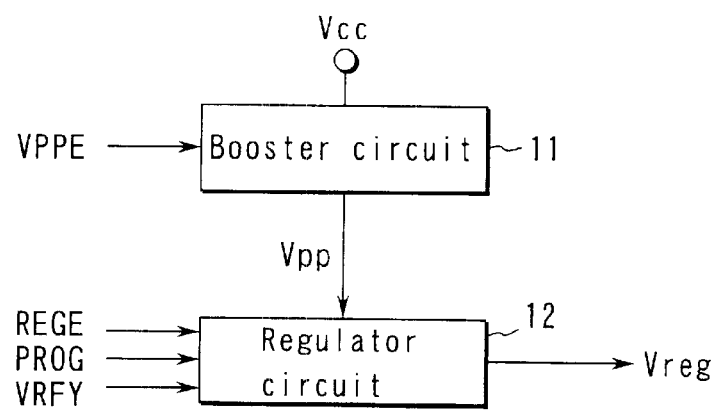
FIG. 4 is a block diagram showing a general boosted voltage generating circuit.

FIG. 4 shows the construction of a boosted voltage generating circuit of a semiconductor memory device disclosed in Jpn. Pat. Appln. KOKAI Publication No. 10-11987 in a block form. For example, the circuit shown in FIG. 4 is contained in a flash memory to generate various voltages applied to the control gate of the memory cell in various operation modes as described before. The boosted voltage generating circuit includes a booster circuit 11 and regulator circuit 12.

The booster circuit 11 is operated when a booster activation signal VPPE is activated and boosts power supply voltage Vcc supplied from the exterior to output voltage Vpp having a value larger than the power supply voltage. The voltage Vpp is supplied to the regulator circuit 12.

The regulator circuit 12 outputs voltage Vreg whose voltage value is smaller than Vpp and which is variably set to a plurality of values based on the voltage Vpp. The operation of the regulator circuit 12 is controlled according to a regulator activation signal REGE, a programming signal PROG activated at the program operation time of the memory cell, and a verifying signal VRFY activated at the program verify operation time of the memory cell.

Figure 5:
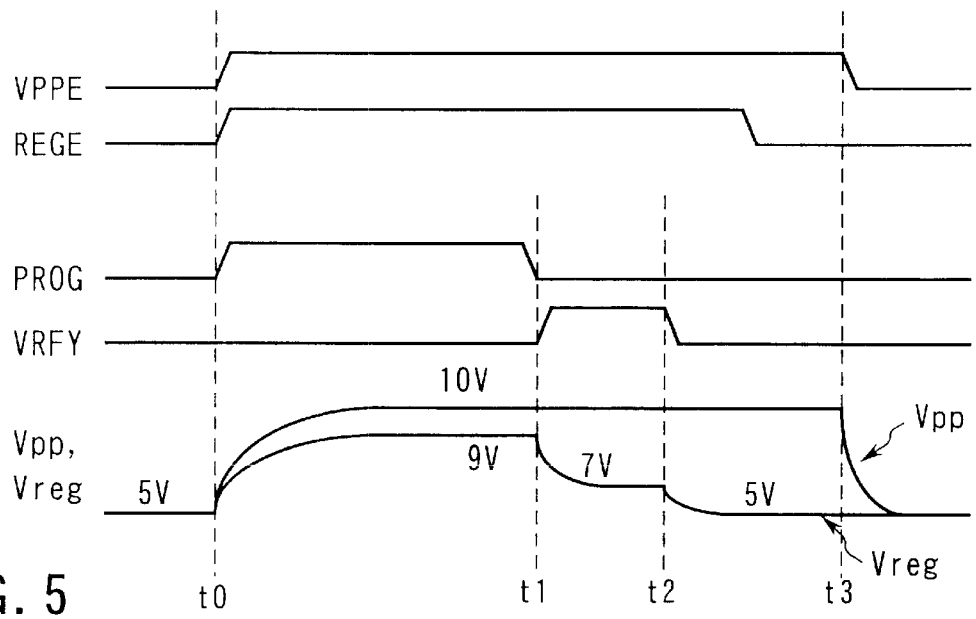
FIG. 5 is a timing chart showing one example of the operation of the circuit shown in FIG. 4.

Next, one example of the operation of the circuit of FIG. 4 is explained with reference to the timing chart of FIG. 5. Before time t0 in FIG. 5, it is assumed that both of the voltages Vpp and Vreg are set at the readout voltage of 5V, for example.

If the booster activation signal VPPE is activated at time t0, the booster circuit 11 starts the operation to start the boosting operation of the power supply voltage Vcc supplied from the exterior. After this, the voltage Vpp rises.

When the operation of the booster circuit 11 becomes stable, the voltage Vpp reaches a specified value and becomes stable. The specified value of the voltage Vpp is set at 10V, for example, and it is the same as the source voltage Vs applied to the source region when the erase process is effected in the memory cell. The voltage Vpp of 10V can be used as the source voltage Vs applied to the source region at the time of erase operation.

The regulator activation signal REGE is activated at time t0, and at the same time, the programming signal PROG is activated. As a result, the regulator circuit 12 is operated and the voltage Vreg rises towards a value of 9V, for example, which is lower than the voltage Vpp and becomes stable after it has reached 9V. The voltage of 9V output as the voltage Vreg while the signal PROG is kept at the "H" level is used as the voltage Vg applied to the control gate electrode of the memory cell at the time of erase operation.

Next, the programming signal PROG is deactivated at time t1 and the verifying signal VRFY is activated. As a result, the output voltage Vreg of the regulator circuit 12 starts to be lowered from 9V to 7V and becomes stable after it has reached 7V. The voltage of 7V output as the voltage Vreg while the signal VRFY is kept at the "H" level is used as the voltage Vpv applied to the control gate electrode of the memory cell at the time of program verify operation.

When the verifying signal VRFY is deactivated at time t2, the output voltage Vreg of the regulator circuit 12 starts to be lowered from 7V towards 5V at which the voltage was initially set. Further, when the booster activation signal VPPE is deactivated at time t3, the operation of the booster circuit 11 is terminated and the voltage Vpp starts to be lowered towards 5V at which the voltage was initially set.

Thus, in the boosted voltage generating circuit of FIG. 4, the voltages with different values applied to the control gate electrode of the memory cell in the various operation modes of the memory cell are generated by using the voltage Vpp output from the booster circuit 11 and sequentially changing the value of the voltage Vpp by use of the regulator circuit 12. Therefore, it is unnecessary to provide booster circuits of the number corresponding to the number of different levels of the voltages generated. Thus, the occupancy area in the chip occupied by the booster circuit at the time of integration can be made small and a consumption current can be reduced.

However, with the boosted voltage generating circuit of FIG. 4, the magnitude of a current flowing between the node of the voltage Vpp and the ground voltage node in the regulator circuit 12 immediately after the program operation is started becomes large, thereby causing the rise of the voltage Vpp and the rise of the voltage Vreg to be delayed in some cases.

Therefore, in the boosted voltage generating circuit according to this invention, attention is paid to eliminate the delay of the rise of the voltage Vpp, Vreg.

Figure 6:
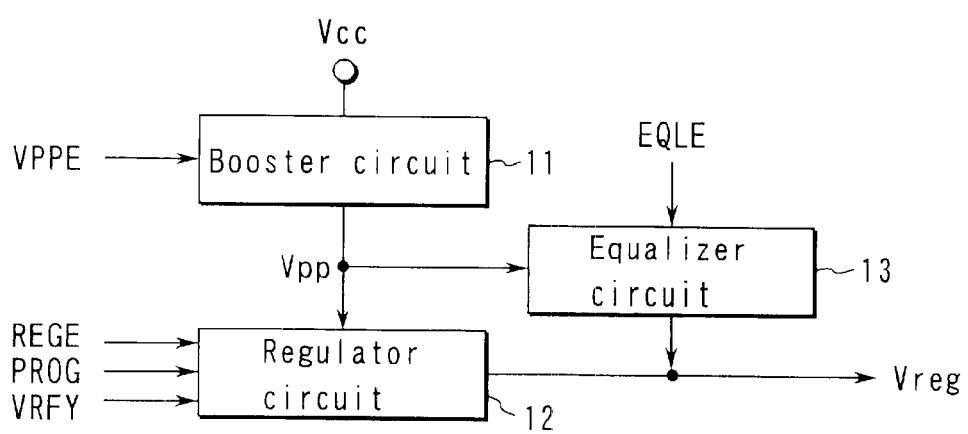
FIG. 6 is a block diagram showing a boosted voltage generating circuit according to a first embodiment of this invention.

FIG. 6 is a block diagram of a boosted voltage generating circuit according to a first embodiment of this invention. The boosted voltage generating circuit is contained in a flash memory and generates various voltages applied to the control gate electrode of the memory cell in various operation modes.

Like the boosted voltage generating circuit shown in FIG. 4, the above boosted voltage generating circuit includes a booster circuit 11 and regulator circuit 12 and further includes an equalizer circuit 13. The booster circuit 11 and regulator circuit 12 have the same construction and function as those of the booster circuit 11 and regulator circuit 12 shown in FIG. 4, and therefore, the explanation thereof is omitted. The equalizer circuit 13 which is newly provided is connected to the booster circuit 11 and regulator circuit 12, the operation thereof is controlled by an equalizing control signal EQLE and the node of the voltage Vpp and the node of the voltage Vreg are short-circuited by the equalizer circuit 13 when the signal EQLE is activated ("H" level).

Next, one example of the operation of the circuit shown in FIG. 6 is explained with reference to the timing chart of FIG. 7. Also, in this case, it is assumed that both of the voltages Vpp and Vreg are set at the readout voltage of 5V, for example, before time t0 in FIG. 7.

If the booster activation signal VPPE is activated at time t0, the booster circuit 11 starts the operation and the voltage Vpp starts to rise. At the same time, the equalizing control signal EQLE is activated and the node of the voltage Vpp and the node of the voltage Vreg are short-circuited by the equalizer circuit 13. As a result, the voltage Vreg rises in the same manner as the voltage Vpp.

Next, when the equalizing control signal EQLE is set to the "L" level at time t1, the short-circuiting state set by the equalizer circuit 13 is released. After this, the output voltage Vpp of the booster circuit 11 reaches a specified value and becomes stable. The specified value of the voltage Vpp is set at 10V, for example, and it is the same as the source voltage Vs applied to the source region when the erase process is effected in the memory cell. The voltage of 10V obtained at this time can be used as the source voltage Vs applied to the source region at the time of erase operation.

The regulator activation signal REGE is activated at time t2 which comes after the voltage Vreg rises to some extent. The programming signal PROG is activated at the same time as activation of the booster activation signal VPPE. The regulator circuit 12 is operated by activation of the signal REGE and the voltage Vreg is controlled and set to 9V, for example, which is lower than the voltage Vpp.

Next, the programming signal PROG is deactivated at time t3 and the verifying signal VRFY is activated. As a result, the output voltage Vreg of the regulator circuit 12 starts to be lowered from 9V to 7V and becomes stable after it has reached 7V.

When the verifying signal VRFY is deactivated at time t4, the output voltage Vreg of the regulator circuit 12 starts to be lowered from 7V towards 5V. Further, when the booster activation signal VPPE is deactivated at time t5, the operation of the booster circuit 11 is terminated and the voltage Vpp starts to be lowered towards 5V at which the voltage was initially set.

Figure 8:
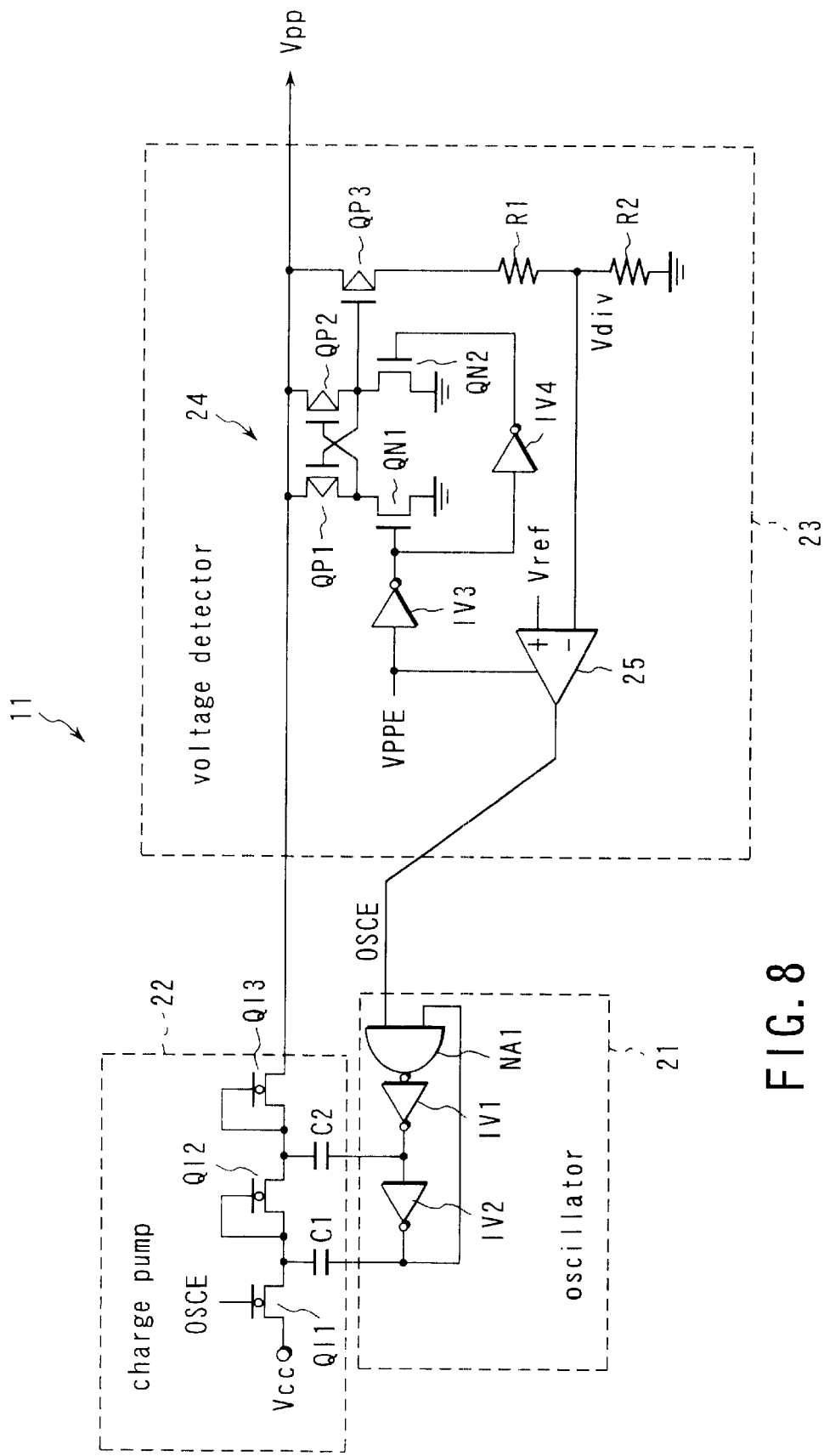
FIG. 8 is a circuit diagram showing one example of the concrete construction of a booster circuit shown in FIG. 6.

FIG. 8 shows one example of the concrete circuit construction of the booster circuit 11 of FIG. 6. The booster circuit 11 includes an oscillator 21, charge pump 22 and voltage detector 23.

The oscillator 21 includes a negative feedback circuit having a NAND gate NA1 and two inverters IV1, IV2, the operation of the negative feedback circuit is controlled according to an oscillator activation signal OSCE output from the voltage detector 23 and the oscillator oscillates at a preset frequency when the negative feedback circuit is operated.

The charge pump 22 includes three I-type (intrinsic type: the threshold voltage thereof is approximately 0V) MOS transistors QI1 to QI3 whose source-drain paths are serially connected between the supply node of the power supply voltage Vcc and the output node of the voltage Vpp, a capacitor C1 connected between the series connection node of the transistors QI1 and QI2 and the output node of the inverter IV2 of the oscillator 21, and a capacitor C2 connected between the series connection node of the transistors QI2 and QI3 and the output node of the inverter IV1 of the oscillator 21.

The oscillator activation signal OSCE output from the voltage detector 23 is supplied to the gate of the transistor QI1 which is disposed in a position closest to the supply node of the power supply voltage Vcc and the gates of the other transistors QI2, QI3 are respectively connected to their own sources or one-side ends of the capacitors C1, C2.

The voltage detector 23 includes an inverter IV3 supplied with the booster activation signal VPPE, an inverter IV4 supplied with an output signal of the inverter IV3, a level shift circuit 24 which has P-channel MOS transistors QP1, QP2 and N-channel MOS transistors QN1, QN2 and in which the outputs of the inverters IV3, IV4 are respectively supplied to the gates of the N-channel MOS transistors QN1, QN2, a P-channel MOS transistor QP3 whose gate is supplied with an output of the level shift circuit 24 and which is connected at one end of the source-drain path to the output node of the voltage Vpp, two voltage dividing resistors R1, R2 serially connected between the other end of the source-drain path of the transistor QP3 and the supply node of the ground voltage and a comparator 25 for comparing a divided voltage Vdiv obtained by use of the resistors R1, R2 with reference voltage Vref and generating the oscillator activation signal OSCE.

In the booster circuit 11, when the booster activation signal VPPE is set to the "H" level, the output of the inverter IV3 of the voltage detector 23 is set to the "L" level, the output of the inverter IV4 is set to the "H" level, and the output of the level shift circuit 24 is set to the "L" level. Then, the P-channel MOS transistor QP3 is turned ON and the voltage Vpp is divided by the two resistors R1, R2. The divided voltage Vdiv thus obtained is compared with the reference voltage Vref by the comparator 25.

Since the voltage Vpp is low immediately after the booster circuit 11 is operated, the relation of Vref>Vdiv is set up and the oscillator activation signal OSCE which is the output of the comparator 25 is set at the "HH" level. When the oscillator activation signal OSCE is set at the "H" level, the oscillator 21 oscillates at a preset frequency. Further, when the signal OSCE is set at the "H" level, the transistor QI1 of the charge pump 22 is turned ON and the oscillation signal of the oscillator 21 is supplied to the sources of the transistors QI2, QI3 of the charge pump 22 via the capacitors C1, C2. Therefore, positive charges are sequentially transferred to the output node of Vpp to sequentially raise the voltage value of Vpp.

When the voltage Vpp rises and exceeds the specified value, the relation of Vref<Vdiv is set up and the oscillator activation signal OSCE is set at the "L" level. As a result, the oscillation operation of the oscillator 21 is interrupted and the charge transfer operation by the charge pump 22 is also interrupted. If the voltage Vpp is lowered and becomes lower than the specified value in this state, the oscillator activation signal OSCE is set at the "H" level again, the oscillation operation is started again and the charge transfer operation by the charge pump 22 is started again. The above operations are repeatedly effected in a period in which the booster activation signal VPPE is kept at the "H" level and the boosted voltage is output from the output node of the voltage Vpp.

Figure 9:
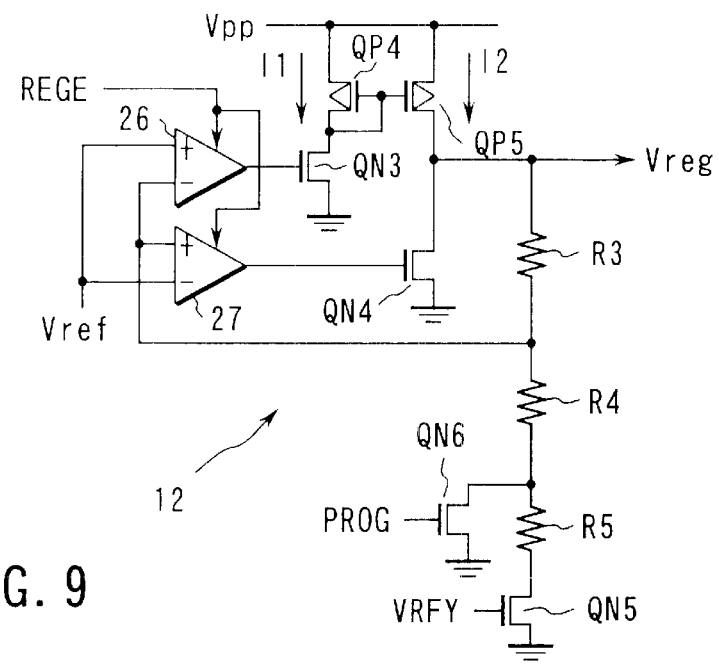
FIG. 9 is a circuit diagram showing one example of the concrete construction of a regulator circuit shown in FIG. 6.

FIG. 9 shows one example of the concrete circuit construction of the regulator circuit 12 of FIG. 6. The regulator circuit 12 includes two comparators 26, 27 whose activation states are controlled by a regulator activation signal REGE, a P-channel MOS transistor QP4 having a source connected to the supply node of the voltage Vpp and a gate electrode connected to the drain thereof, a P-channel MOS transistor QP5 having a source connected to the supply node of the voltage Vpp, a gate electrode commonly connected to the gate of the transistor QP4 and a drain connected to the output node of the voltage Vreg and constituting a current mirror circuit in cooperation with the transistor QP4, an N-channel MOS transistor QN3 having a drain connected to the drain of the transistor QP4, a source connected to the ground voltage node and a gate electrode supplied with an output of the comparator 26, an N-channel MOS transistor QN4 having a drain connected to the drain of the transistor QP5, a source connected to the ground voltage node and a gate electrode supplied with an output of the comparator 27, three voltage-dividing resistors R3, R4, R5 serially connected between the output node of the voltage Vreg and the ground voltage node, an N-channel MOS transistor QN5 having a source-drain path connected between the resistor R5 among the three resistors R3, R4, R5 which is disposed in a position closest to the ground voltage node and the ground voltage node and a gate electrode supplied with a verifying signal VRFY, and an N-channel MOS transistor QN6 having a source-drain path connected between the series connection node of the resistors R4 and R5 among the three resistors R3, R4, R5 and the ground voltage node and a gate electrode supplied with a programming signal PROG.

The reference voltage Vref is supplied to the non-inverting input terminal (+) of the comparator 26 and the inverting input terminal (−) of the comparator 27 and the divided voltage at the series connection node of the two resistors R3, R4 is supplied to the inverting input terminal (−) of the comparator 26 and the non-inverting input terminal (+) of the comparator 27. The comparators 26, 27 are operated to compare the input voltages when the regulator activation signal REGE is set at the "H" level.

Figure 7:
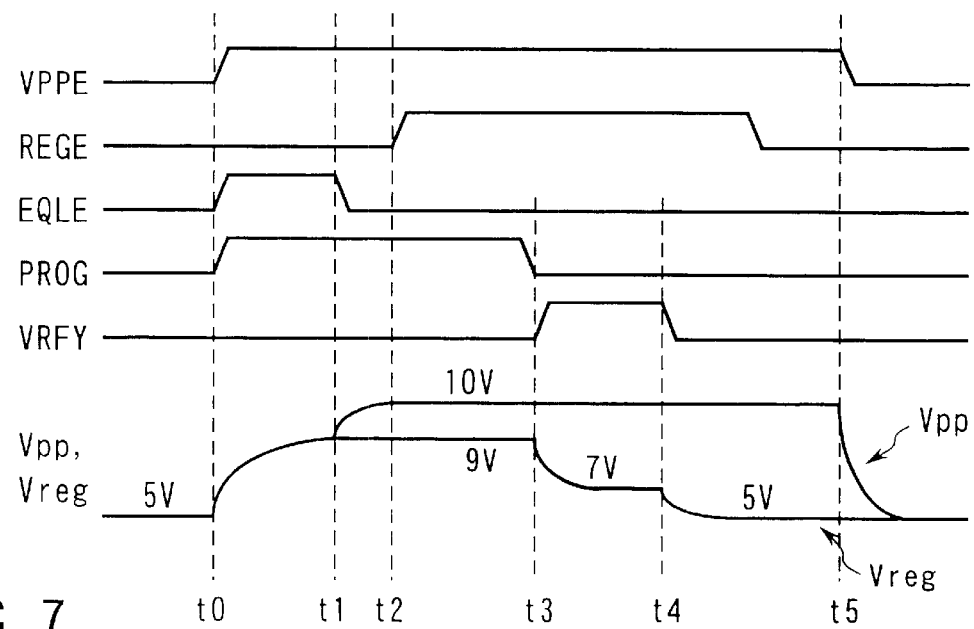
FIG. 7 is a timing chart for illustrating one example of the operation of the circuit shown in FIG. 6.

In the regulator circuit 12, the regulator activation signal REGE is set at the "L" level in a period between times t0 and t1 shown in FIG. 7, the two comparators 26, 27 are set in the deactivated state and neither of them are operated.

If the regulator activation signal REGE is set at the "H" level at time t2 in FIG. 7, the two comparators 26, 27 are activated and both set into the operative state. If the programming signal PROG is set to the "H" level at time t1 earlier than t1, the transistor QN6 is turned ON, the voltage Vreg is divided by the two resistors R3 and R4 and the divided voltage obtained at this time is input to the comparators 26, 27.

In this case, the node of the voltage Vreg is connected to the supply node of the voltage Vpp by the equalizer circuit 13, the voltage Vreg is sufficiently raised, the divided voltage obtained by dividing the voltage Vreg by use of the two resistors R3, R4 becomes higher than the voltage Vref, the output of the comparator 26 is set to the "L" level and the output of the comparator 27 is set to the "H" level. As a result, the transistor QN4 is turned ON and the transistor QN3 is turned OFF, the node of the voltage Vreg is discharged towards the potential of the ground voltage node via the transistor QN4 and thus the voltage Vreg starts to be lowered.

When the voltage Vreg is lowered and becomes lower than 9V which is set as the specified value, the divided voltage at the series connection node of the resistors R3 and R4 becomes lower than the reference voltage Vref, and as a result, the output of the comparator 26 is inverted from the "L" level to the "H" level and the output of the comparator 27 is inverted from the "H" level to the "L" level. At this time, the transistor QN3 is turned ON and the transistor QN4 is turned OFF and a current I1 shown in FIG. 9 flows from the node of the voltage Vpp towards the ground voltage node via the transistors QP4 and QN3. By causing the current I1 to flow, a current I2 shown in FIG. 9 flows from the node of the voltage Vpp (the specified value is 10V) towards the node of the voltage Vreg via the transistor QP5 so as to charge the node of the voltage Vreg. As a result, the voltage Vreg which has become lower than 9V starts to rise.

Thus, the divided voltage at the series connection node of the resistors R3 and R4 and the reference voltage Vref are compared with each other by the comparators 26, 27, the ON/OFF states of the N-channel MOS transistors QN3, QN4 are controlled according to the result of comparison and the voltage Vreg is controlled so as to be always set equal to the specified value (9V) at the program time by charging/discharging the node of the voltage Vreg.

In a period between times t3 and t4 of FIG. 7 in which the programming signal PROG is set at the "L" level and the verifying signal VRFY is set at the "H" level, the transistor QN6 is turned OFF and the transistor QN5 is turned ON, and therefore, the voltage Vreg is divided by the three resistors R3, R4, R5 and the divided voltage obtained based on the resistance dividing ratio which is smaller than that at the program time is input to the comparators 26, 27. In this case, the resistances of the resistors R3, R4, R5 are so set that the divided voltage obtained when the voltage Vreg reaches 7V which is lower than 9V set as the specified value will become equal to the divided voltage obtained when the voltage Vreg is set at 9V.

Therefore, at the time of verify, the divided voltage generated at the series node of the resistors R3 and R4 is compared with the reference voltage Vref by the comparators 26, 27, the ON/OFF states of the N-channel MOS transistors QN3, QN4 are controlled according to the result of comparison, and the voltage Vreg is controlled so as to be always set equal to the specified value (7V) at the time of verify by charging/discharging the node of the voltage Vreg.

Figure 10:
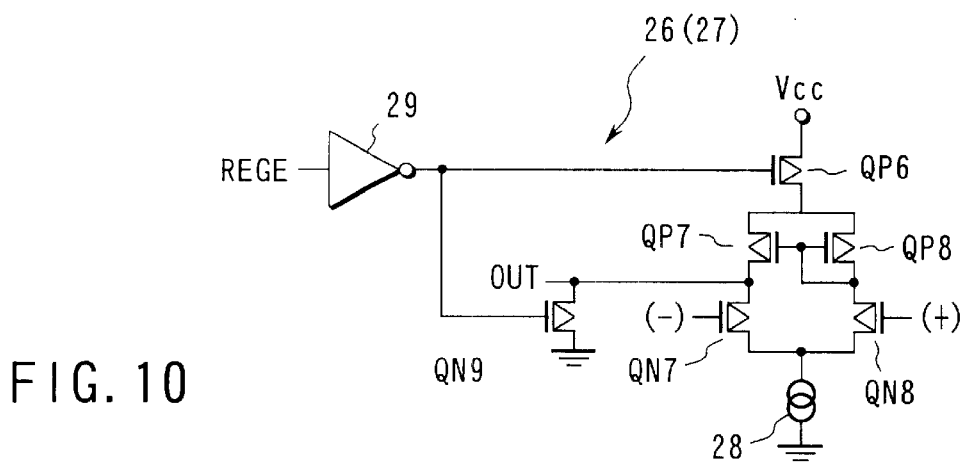
FIG. 10 is a circuit diagram showing one example of the concrete construction of a comparator shown in FIG. 9.

FIG. 10 shows one example of the concrete circuit construction of the comparators 26, 27 shown in FIG. 9. The source of a P-channel MOS transistor QP6 is connected to the supply node of the power supply voltage Vcc. The sources of two P-channel MOS transistors QP7, QP8 are connected to the drain of the transistor QP6. The gate electrodes of the transistors QP7, QP8 are connected together and the drain of the transistor QP8 is connected to the common connection node of the gate electrodes. The drain of the transistor QP7 is connected to the drain of an N-channel MOS transistor QN7. The gate electrode of the transistor QN7 is used as the inverting input terminal (−). The drain of the transistor QP8 is connected to the drain of an N-channel MOS transistor QN8. The gate electrode of the transistor QN8 is used as the non-inverting input terminal (+). The sources of the transistors QN7, QN8 are connected together and a current source 28 is connected between the source common connection node and the ground voltage node. That is, the transistors QP6, QP7, QP8, QN7, QN8 and current source 28 are combined to constitute a current mirror load type differential amplifier.

The regulator activation signal REGE is input to an inverter 29 and the output of the inverter 29 is input to the gate electrode of the P-channel MOS transistor QP6. Further, the output of the inverter 29 is input to the gate electrode of an N-channel MOS transistor QN9. The source of the MOS transistor QN9 is connected to the output node OUT of the differential amplifier which is the drain common connection node of the P-channel MOS transistor QP7 and N-channel MOS transistor QN6 and the drain thereof is connected to the ground voltage node.

When the regulator activation signal REGE is set at the "L" level in the comparator 26 (27), the output of the inverter 29 is set to the "H" level to turn OFF the P-channel MOS transistor QP6 and turn ON the N-channel MOS transistor QN9. At this time, the differential amplifier is not operated, the output node OUT is connected to the ground voltage node via the transistor QN9 and a signal of the output node OUT is set to the "L" level irrespective of the voltages input to the inverting input terminal (−) and a non-inverting input terminal (+).

When the regulator activation signal REGE is set at the "H" level, the output of the inverter 29 is set to the "L" level to turn ON the P-channel MOS transistor QP6 and the differential amplifier is set into the operative state so that the voltages input to the inverting input terminal (−) and non-inverting input terminal (+) can be compared with each other by the differential amplifier. At this time, if the voltage input to the non-inverting input terminal (+) is higher than the voltage input to the inverting input terminal (−), the N-channel MOS transistor QN8 is turned ON and the signal of the output node OUT is set to the "H" level. On the other hand, if the voltage input to the non-inverting input terminal (+) is lower than the voltage input to the inverting input terminal (−), the N-channel MOS transistor QN7 is turned ON and the signal of the output node OUT is set to the "L" level.

Figure 11:
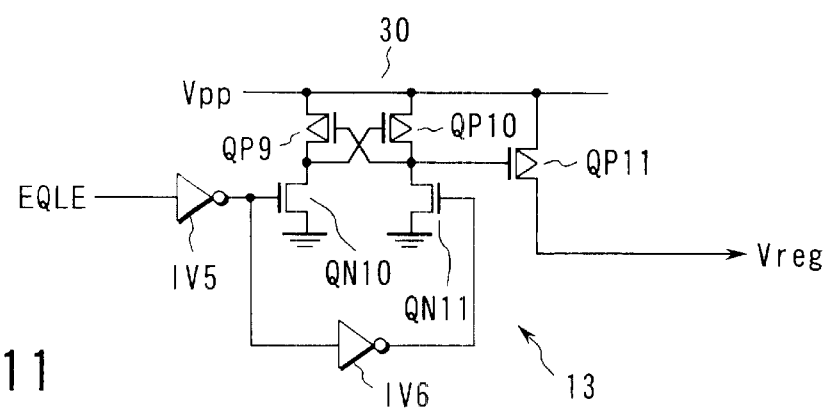
FIG. 11 is a circuit diagram showing one example of the concrete construction of a equalizer circuit shown in FIG. 6.

FIG. 11 shows one example of the concrete circuit construction of the equalizer circuit 13 in FIG. 6. The equalizer circuit 13 includes an inverter IV5 supplied with a equalizing control signal EQLE, an inverter IV6 supplied with an output of the inverter IV5, a level shift circuit 30 which has P-channel MOS transistors QP9, QP10 and N-channel MOS transistors QN10, QN11 and in which the outputs of the inverters IV5, IV6 are input to the gates of the N-channel MOS transistors QN10, QN11, and a P-channel MOS transistor QP11 having a gate electrode supplied with an output of the level shift circuit 30, a source connected to the output node of the voltage Vpp and a drain connected to the output node of the voltage Vreg.

In the equalizer circuit 13, when the equalizing control signal EQLE is set at the "H" level, the output of the inverter IV5 is set at the "L" level and the output of the inverter IV6 is set at the "H" level so that the transistors QN10 will be turned OFF, the transistor QN11 will be turned ON and the output of the level shift circuit 30 will be set at the "L" level. As a result, the transistor QP11 is turned ON to short-circuit the node of the voltage Vpp and the node of the voltage Vreg.

On the other hand, when the equalizing control signal EQLE is set at the "L" level, the output of the inverter IV5 is set at the "H" level and the output of the inverter IV6 is set at the "L" level so that the transistors QN10 will be turned ON, the transistor QN11 will be turned OFF and the output of the level shift circuit 30 will be set at the "H" level (Vpp). As a result, the transistor QP11 is turned OFF to separate the node of the voltage Vpp and the node of the voltage Vreg from each other.

Thus, like the boosted voltage generating circuit of FIG. 4, in the boosted voltage generating circuit of FIG. 6, voltages of different values applied to the control gate electrode of the memory cell in various operation modes of the memory cell are generated by using the voltage Vpp output from the booster circuit 11 and variously setting the value of the voltage Vpp by use of the regulator circuit 12, the following effect can be obtained in addition to the same effect obtained in the circuit of FIG. 4.

In the circuit of this embodiment shown in FIG. 6, the regulator circuit 12 is kept inoperative immediately after the boosting operation of the booster circuit 11 is started and the equalizer circuit 13 is operated instead so as to short-circuit the node of the voltage Vpp and the node of the voltage Vreg. That is, as shown in FIG. 7, the operation period of the regulator circuit 12 and the short-circuiting operation period of the equalizer circuit 13 do not overlap each other. Therefore, a large current (current I1 in FIG. 9) which flowed into the ground voltage node at the rise time of the voltage Vpp does not flow so that the voltage Vpp and voltage Vreg can rise at higher speed. Further, since a large current which flowed into the ground voltage node immediately after the boosting operation of the booster circuit 11 is started does not flow, the consumption current can be significantly reduced in comparison with that in the case of FIG. 4.

Figure 12:
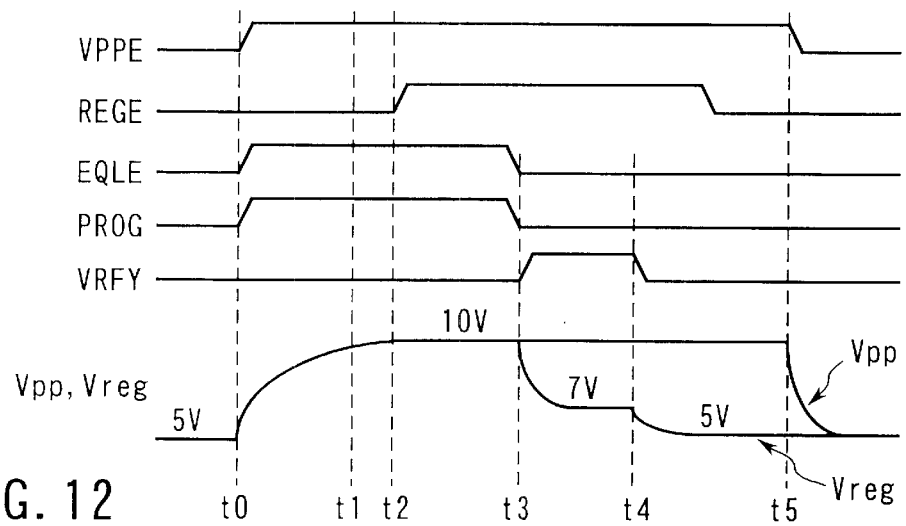
FIG. 12 is a timing chart for illustrating one example of the operation which is different from the operation shown in FIG. 7.

In the above explanation for the operation of the embodiment, a case wherein the operative period of the regulator circuit 12 and the short-circuiting operation period of the equalizer circuit 13 do not overlap each other as shown in the timing chart of FIG. 7 is explained, but as shown in the timing chart of FIG. 12, the timing at which the equalizing control signal EQLE falls to the "L" level can be delayed to the timing at which the programming signal PROG falls to the "L" level (t3 in FIG. 12). In this case, the operative period of the regulator circuit 12 and the short-circuiting operation period of the equalizer circuit 13 partly overlap each other.

Thus, by setting the period in which the equalizing control signal EQLE is activated equal to the period in which the programming signal PROG is activated, the voltage of the control gate of the memory cell at the program time and the well voltage at the erase time can be set equal to each other when the voltage Vpp is supplied to the well region.

Figure 13:
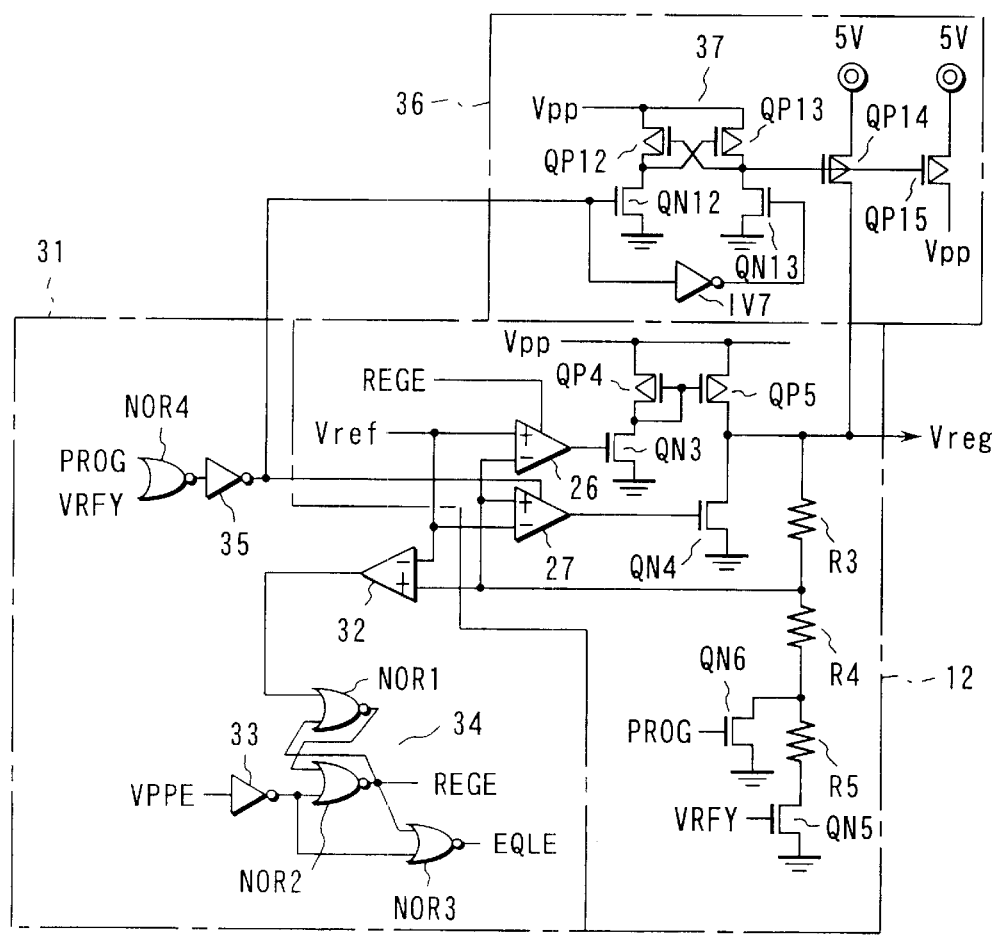
FIG. 13 is a circuit diagram showing the concrete construction of the regulator circuit shown in FIG. 6 according to a modification of the first embodiment of this invention together with another circuit including a control signal generating circuit.

Next, a modification of the first embodiment is explained below. FIG. 13 shows another example of the concrete circuit construction of the regulator circuit 12 of FIG. 6 together with a control circuit such as a control signal generating circuit for generating the regulator activation signal REGE and equalizing control signal EQLE.

The regulator circuit 12 shown in FIG. 13 is different from that of FIG. 9 in that the activating operation of the comparator 27 is not controlled by the regulator activation signal REGE but by another control signal generated by a signal generating circuit which will be described later.

A control signal generating circuit 31 generates the regulator activation signal REGE, equalizing control signal EQLE and the like according to the programming signal PROG, verifying signal VRFY and the like. The circuit 31 includes a comparator 32 for comparing the reference voltage Vref with a divided voltage at the series connection node of the resistors R3 and R4 in the regulator circuit 12, an inverter 33 supplied with the booster activation signal VPPE, two NOR gates NOR1, NOR2 whose one-side input terminals are respectively supplied with the outputs of the comparator 32 and the inverter 33, the other input terminals and output terminals thereof being cross-coupled to constitute a latch circuit 34, a NOR gate NOR3 supplied with the output of the NOR gate NOR2 and the output of the inverter 33, a NOR gate NOR4 supplied with the programming signal PROG and verifying signal VRFY, and an inverter 35 supplied with the output of the NOR gate NOR4.

The regulator activation signal REGE is generated from the NOR gate NOR2. The regulator activation signal REGE is input to the comparator 26 in the regulator circuit 12. The equalizing control signal EQLE is generated from the NOR gate NOR3 and input to the equalizer circuit 13 shown in FIG. 6. Further, the output of the inverter 35 is input as an activation signal to the comparator 27 in the regulator circuit 12.

A voltage setting circuit 36 sets the node of the voltage Vreg and the node of the voltage Vpp to boosted voltage, for example, 5V before the boosting operation of the booster circuit 11 is started and after the boosting operation is terminated. The circuit 36 includes an inverter IV7 supplied with the output of the inverter 35 in the control signal generating circuit 31, a level shift circuit 37 which has P-channel MOS transistors QP12, QP13 and N-channel MOS transistors QN12, QN13 and in which the outputs of the inverters 35 and IV7 are supplied to the gates of the N-channel MOS transistors QN12, QN13, a P-channel MOS transistor QP14 having a gate electrode supplied with the output of the level shift circuit 37, a source connected to the 5V supply node and a drain connected to the node of the voltage Vreg, and a P-channel MOS transistor QP15 having a source connected to the 5V supply node and a drain connected to the node of the voltage Vpp.

Figure 14:
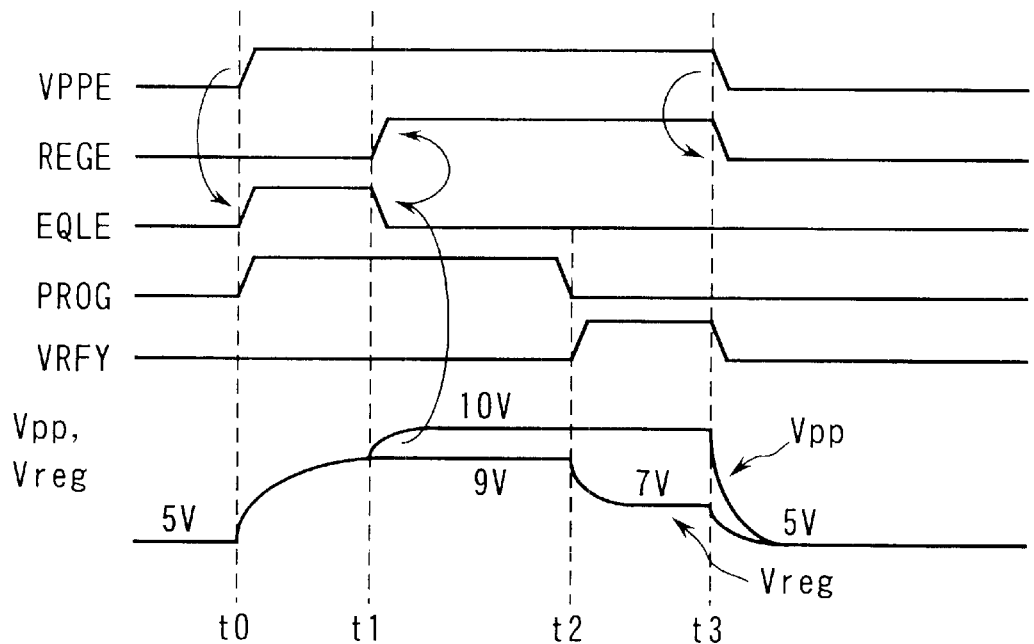
FIG. 14 is a timing chart for illustrating one example of the operation of the circuit shown in FIG. 13.

Next, one example of the operation of the circuit shown in FIG. 13 is explained with reference to the timing chart of FIG. 14. First, since the programming signal PROG and verifying signal VRFY are both set at the "L" level before time t0, the output of the NOR gate NOR4 in the signal generating circuit 31 is set at the "H" level and the output of the inverter 35 supplied with the output of the NOR gate NOR4 is set at the "L" level. Further, the output of the inverter IV7 of the voltage setting circuit 36 which is supplied with the output of the inverter 35 is set at the "H" level. At this time, the N-channel MOS transistors QN12 and QN13 of the level shift circuit 37 in the voltage setting circuit 36 are respectively turned OFF and ON and the output of the level shift circuit 37 is set to the "L" level. As a result, the two P-channel MOS transistors QP14, QP15 whose gates are supplied with the output of the level shift circuit 37 are turned ON so as to permit a voltage of 5V to be supplied to the node of the voltage Vreg and the node of the voltage Vpp, and thus the voltages Vreg and Vpp are both set at 5V.

If the booster activation signal VPPE is activated ("H" level) at time t0, the booster circuit 11 starts the boosting operation and the voltage Vpp starts to rise. Further, when the signal VPPE is set at the "H" level, the output of the inverter 33 in the signal generating circuit 31 is set to the "L" level. Assuming now that the regulator activation signal REGE which is the output of the NOR gate NOR2 constructing the latch circuit 34 is previously set at the "L" level, the equalizing control signal EQLE which is the output of the NOR gate NOR3 is set at the "H" level. As described before, the transistor QP11 of the equalizer circuit 13 of FIG. 11 is turned ON in response to the signal EQLE to short-circuit the node of the voltage Vpp and the node of the voltage Vreg.

When the programming signal PROG is set at the "H" level at time t0, the output of the NOR gate NOR4 in the signal generating circuit 31 is inverted to the "L" level and the output of the inverter 35 is inverted to the "H" level so that the N-channel MOS transistors QN12 and QN13 of the level shift circuit 37 in the voltage setting circuit 36 will be respectively turned ON and OFF and the output of the level shift circuit 37 will be inverted to the "H" level. As a result, the two P-channel MOS transistors QP14, QP15 whose gate electrodes are supplied with the output of the level shift circuit 37 are turned OFF so as to separate the nodes of the voltages Vreg and Vpp from the 5V supply node. Therefore, the voltage Vreg and the output voltage Vpp of the booster circuit 11 gradually rise.

The output voltage Vreg of the regulator circuit 12 rises as the output voltage Vpp of the booster circuit 11 rises, and if the voltage Vreg reaches a specified value (9V) at time t1 and the divided voltage obtained by use of the two resistors R3, R4 in the regulator circuit 12 exceeds the reference voltage Vref as described before, the output of the comparator 32 of the control signal generating circuit 31 is set to the "H" level, and as a result, the regulator activation signal REGE which is the output of the NOR gate NOR2 of the latch circuit 34 is inverted from the "L" level to the "H" level and the comparator 26 in the regulator circuit 12 is activated. At this time, since the programming signal PROG is set at the "H" level, the output of the NOR gate NOR4 of the signal generating circuit 31 is set at the "L" level and the output of the inverter 35 is set at the "H" level, then the comparator 27 of the regulator circuit 12 is also activated. Therefore, after this, as described before, the ON/OFF states of the N-channel MOS transistors QN3, QN4 are controlled by the outputs of the two comparators 26, 27 to perform the control operation for stabilizing the voltage Vreg.

If the regulator activation signal REGE is inverted to the "H" level, the equalizing control signal EQLE which is the output of the NOR gate NOR3 is set to the "L" level. As a result, the short-circuiting state by the equalizer circuit 13 is released.

Next, at time t2, the programming signal PROG is set to the "L" level and the verifying signal VRFY is set to the "H" level. At this time, since the output of the inverter 35 of the signal generating circuit 31 is kept unchanged at the "H" level, the comparator 27 in the regulator circuit 12 is kept active. At this time, the N-channel MOS transistor QN5 is turned ON instead of the N-channel MOS transistor QN6 in the regulator circuit 12 to change the division ratio of the voltage Vreg as described before. As a result, the voltage Vreg is lowered from 9V to 7V as described before and is then controlled to be stably set at 7V.

Next, at time t3, the booster activation signal VPPE is deactivated ("L" level). As a result, the booster circuit 11 terminates the boosting operation. Further, if the signal VPPE is set to the "L" level, the output of the inverter 35 in the signal generating circuit 31 is set to the "H" level and the regulator activation signal REGE which is the output of the NOR gate NOR2 constructing the latch circuit 34 is set to the "L" level to terminate the operation of the regulator circuit 12. Further, the verifying signal VRFY is set to the "L" level at the same time as deactivation of the booster activation signal VPPE. At this time, since the programming signal PROG is already set at the "L" level, the output of the NOR gate NOR4 of the signal generating circuit 31 is set to the "H" level and the output of the inverter 35 is set to the "L" level, and therefore, as described before, the two P-channel MOS transistors QP14, QP15 of the voltage setting circuit 31 are both turned ON, a voltage of 5V is supplied to the nodes of the voltages Vreg and Vpp so that the voltages Vreg and Vpp can be both set at 5V again.

Thus, in the circuit shown in FIG. 13, the equalizing control signal EQLE rises in synchronism with the rise of the booster activation signal VPPE, the equalizing control signal EQLE falls and the regulator activation signal REGE rises after the voltage Vreg reaches 9V which is the specified value. As a result, a period of wasteful time from the time when the equalizing control signal EQLE falls until the regulator activation signal REGE rises can be substantially eliminated. Therefore, it is unnecessary to make the period for activation of the regulator activation signal REGE unnecessarily long in comparison with a case shown in the timing chart of FIG. 7 and it becomes possible to operate the regulator circuit 12 at adequate timing.

Figure 15:
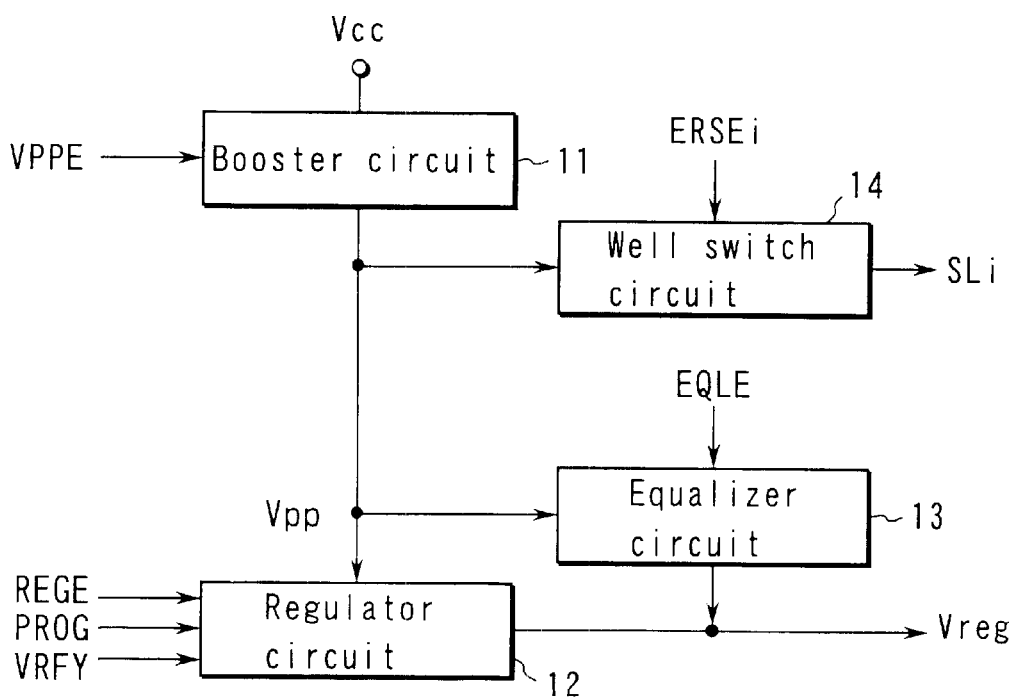
FIG. 15 is a block diagram showing a boosted voltage generating circuit according to a second embodiment of this invention.

FIG. 15 shows a boosted voltage generating circuit according to a second embodiment of this invention. Like the boosted voltage generating circuit of FIG. 6, the boosted voltage generating circuit of this embodiment includes a booster circuit 11, regulator circuit 12 and equalizer circuit 13 and it further includes a well switch circuit 14.

Figure 1:
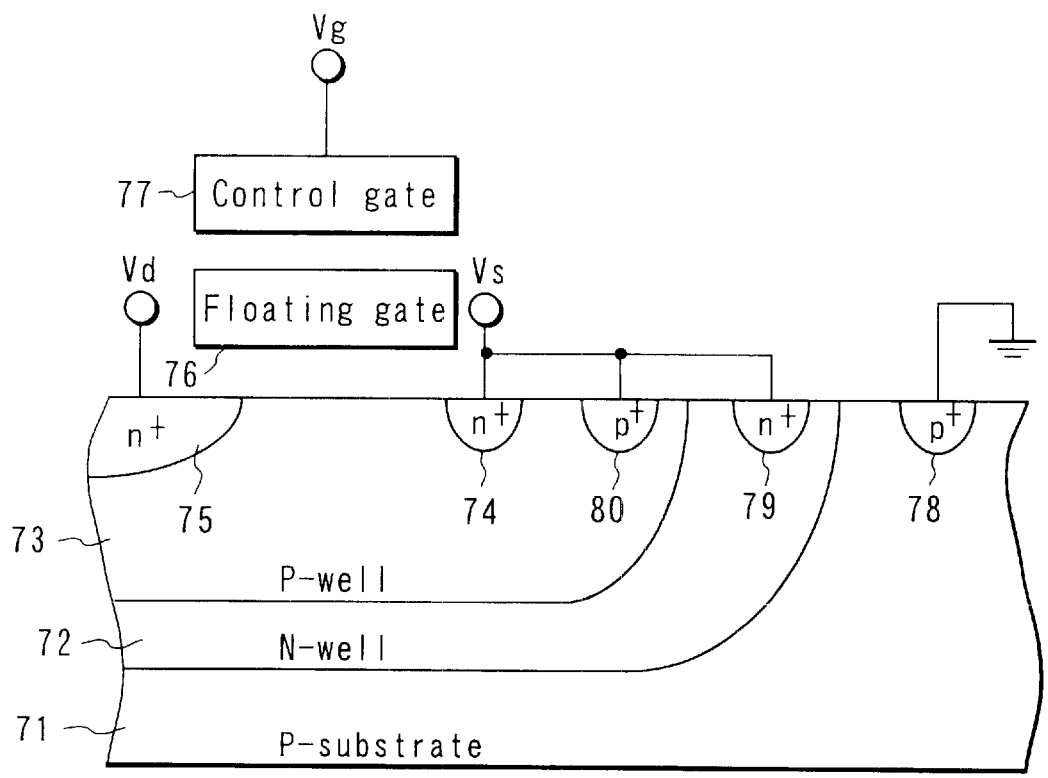
FIG. 1 is a view showing the cross sectional structure of one memory cell in a flash memory.
Figure 2:
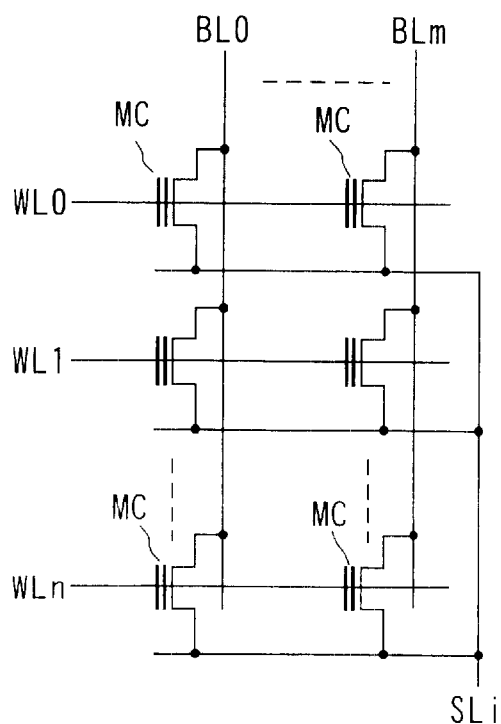
FIG. 2 is a diagram showing an example of the circuit of a memory cell array of a NOR type flash memory.
Figure 3:
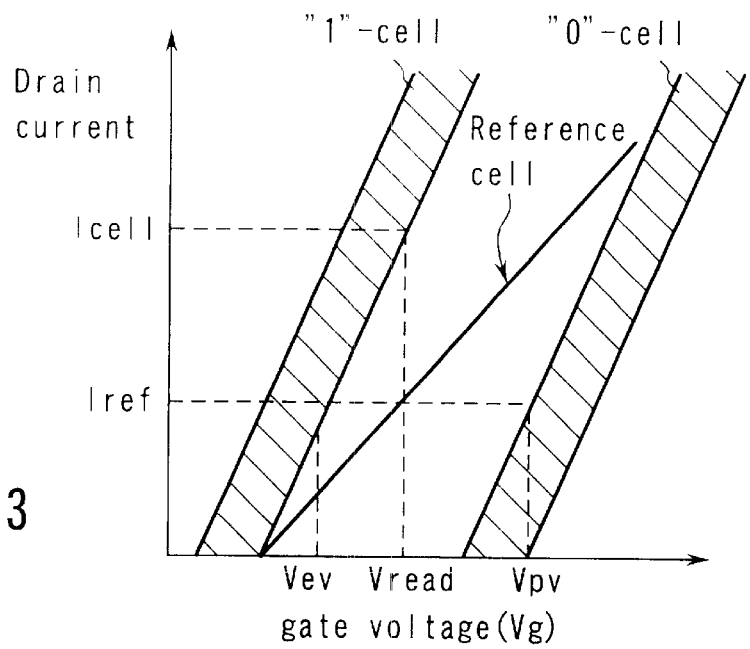
FIG. 3 is a characteristic diagram showing the relation between gate voltage applied to the control gate electrode of a memory cell and a drain current of the memory cell.

The well switch circuit 14 is connected to the booster circuit 11. The well switch circuit 14 selects voltage Vpp output from the booster circuit 11 according to an erase selection signal ERSEi at the erase time and outputs the selected voltage to a source line Sli shown in FIG. 2.

That is, in the boosted voltage generating circuit of this embodiment, the voltage Vpp of 10V obtained by the booster circuit 11 is used as source voltage Vs supplied to the source line Sli at the erase time of the memory cell. In this case, the "H" level of the erase selection signal ERSEi is Vpp.

Figure 16:
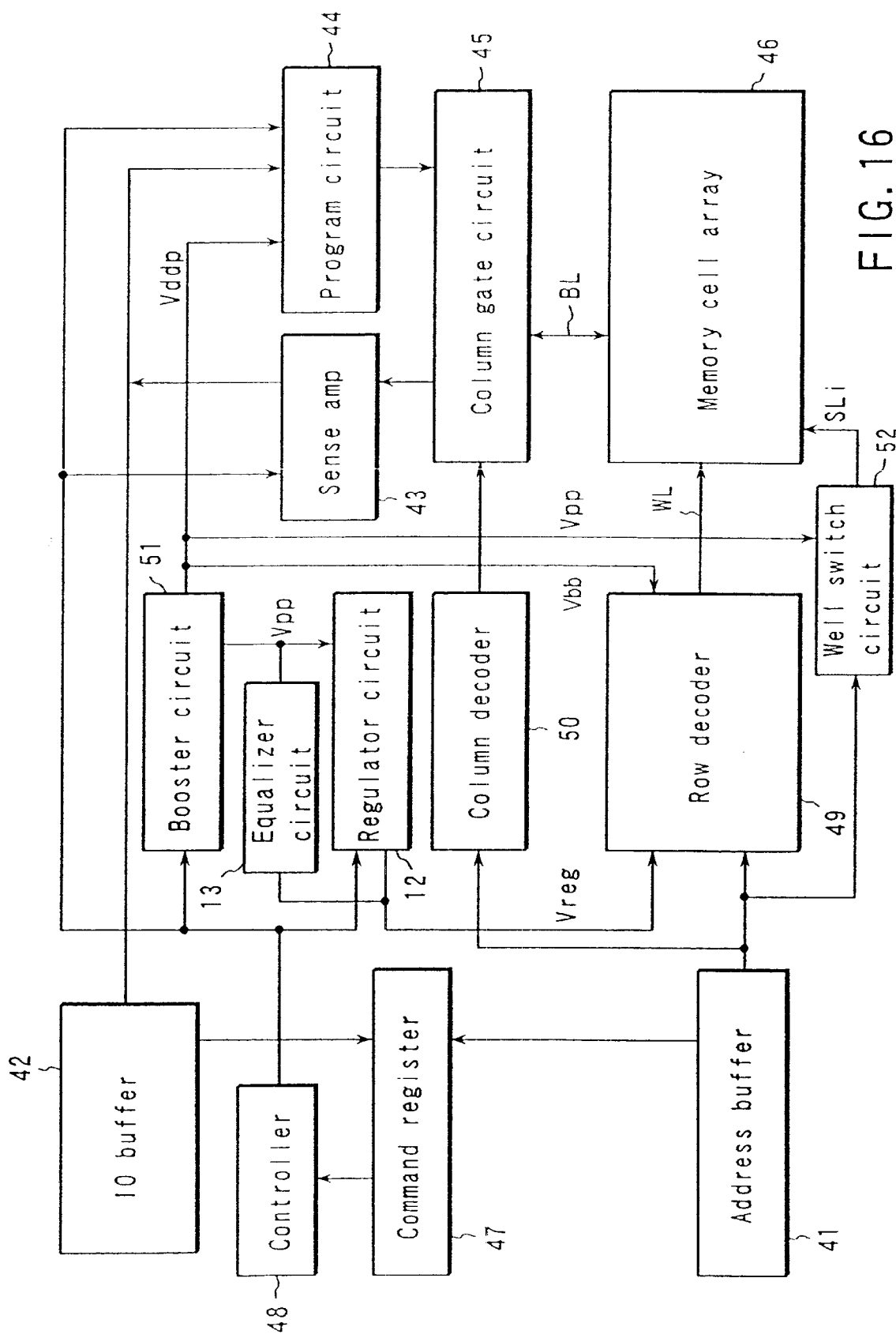
FIG. 16 is a block diagram showing the whole construction of a memory formed when this invention is applied to a flash memory.

FIG. 16 is a block diagram showing the whole construction of the memory when this invention is applied to a flash memory. An address buffer 41 receives an external address and outputs an internal address corresponding to a memory cell to be subjected to the readout process, program process or erase process. An I/O buffer 42 outputs data of a memory cell to be sensed by a sense amplifier 43 to the exterior at the readout time and inputs program data supplied from the exterior to a program circuit 44 at the program time. The program circuit 44 supplies program voltage to a corresponding one of bit lines in a memory cell array 46 via a column gate circuit 45.

A command register 47 holds commands such as program and erase commands supplied from the exterior and a controller 48 receives the command held in the command register 47 and outputs control signals for controlling various circuits in the memory. A row decoder 49 receives the internal address output from the address buffer 41 to select a corresponding one of word lines in the memory cell array 46. A column decoder 50 receives the internal address output from the address buffer 41 to selectively drive the column gate in the column gate circuit 45 according to the internal address. As a result, the selected bit line in the memory cell array 46 is connected to the sense amplifier 43 via the column gate circuit 45.

A booster circuit 51 includes a charge pump circuit and the like, generates positive voltages Vpp, Vddp higher than the external power supply voltage by boosting or raising the external power supply voltage and generates 0V or negative voltage Vbb. The voltage Vddp generated from the booster circuit 51 is supplied to the program circuit 44. The voltage Vpp generated from the booster circuit 51 is supplied to the regulator circuit 12. The function of the regulator circuit 12 is the same as described before and the explanation thereof is omitted. The equalizer circuit 13 described before is connected between the booster circuit 51 and the regulator circuit 12. Also, the function of the equalizer circuit 13 is the same as described before and the explanation thereof is omitted.

The voltage Vpp generated from the booster circuit 51 is also supplied to the well switch circuit 52. The well switch circuit 52 corresponds to the well switch circuit 14 shown in FIG. 15, selects the voltage Vpp output from the booster circuit 51 according to the internal address output from the address buffer 41 at the erase time and outputs the selected voltage to the source line SLi in the memory cell array 46 shown in FIG. 2.

The negative voltage Vbb generated from the booster circuit 51 is supplied to the row decoder 49.

In the flash memory with the above construction, since the voltage Vreg with various values to be supplied to the word line, that is, the control gate electrode of the memory cell at the program time or readout time of the memory cell is obtained by using voltage generated from one booster circuit (charge pump circuit) and changing the voltage to voltage having a plurality of values smaller than that of the above voltage by use of the regulator circuit 12, it becomes unnecessary to use a plurality of charge pump circuits. As a result, the whole area of the chip can be prevented from becoming large. In addition, since a relatively large current flows in the charge pump circuit and the consumption current is large, the whole consumption current can be reduced by reducing the number of charge pump circuits. The voltage Vreg is supplied to the word line WL of the memory cell array 46, that is, the control gate electrode of the memory cell via the row decoder 49.

The following table 2 indicates the relation between the various operation modes of the flash memory of FIG. 16 and the voltages Vpp, Vreg, Vddp, Vbb.

TABLE 2

| Operation mode | Vpp | Vreg | Vddp | Vbb |
| --- | --- | --- | --- | --- |
| Readout | 5 V | 5 V | Vcc | 0 V |
| Program | 10 V | 7 to 10 V (0.5 V step up) | 5 V | 0 V |
| Program Verify | 10 V | 6.5 V | 5 V | 0 V |
| Erase | 10 V | 2.5 V | 5 V | −5 to −7.5 V (0.5 V step up) |
| Erase Verify | 10 V | 4 V | 5 V | −1 V |
| Excessive Erase Verify | 10 V | 2.5 V | 5 V | −1 V |
| Weak Program | 10 V (0.5 V step up) | 2.5 to 5 V | 5 V | −1 V |

Figure 17:
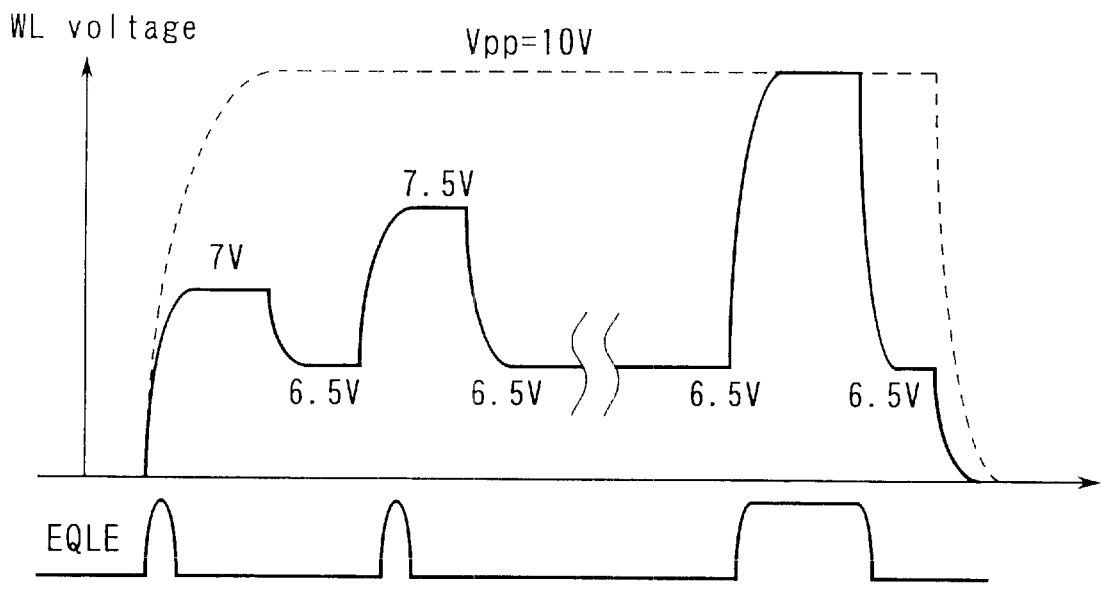
FIG. 17 is a waveform diagram showing the relation between the word line voltage and a equalizing control signal EQLE in the memory shown in FIG. 16.

The program operation is performed according to the step-up program for raising the word line voltage (control gate voltage of the memory cell) bit by bit. The relation between the word line (WL) voltage by the program operation based on the step-up program and the equalizing control signal EQLE for controlling the operation of the equalizer circuit 13 is shown in FIG. 17.

In this example, the voltage Vreg generated from the regulator circuit 12 is stepped up by 0.5V at one time in a voltage range of 7V to 10V in such a manner as indicated by 7V, 6.5V, 7.5V, 6.5V, . . . , 10V. In this case, the equalizing control signal EQLE is activated only at the time of level change at which the program voltage rises in the range of the program voltage from 7V to 9.5V. Further, when the program voltage is set at the same voltage of 10V as the boosted voltage Vpp, the equalizing control signal EQLE is activated while the program voltage is set at the voltage of 10V.

The program verify mode is a mode in which whether or not data is sufficiently programmed after programming is determined by reading out data and, in the program verify mode, the voltage Vreg or the voltage supplied to the control gate electrode of the memory cell is set at 6.5V which is lower than in the case of program mode. Likewise, the erase verify mode is a mode in which whether or not data is sufficiently erased after erasing is determined by reading out data and, in the erase verify mode, the voltage Vreg or the voltage supplied to the control gate electrode of the memory cell is set at 2.5V which is lower than in the case of erase mode.

Figure 18:
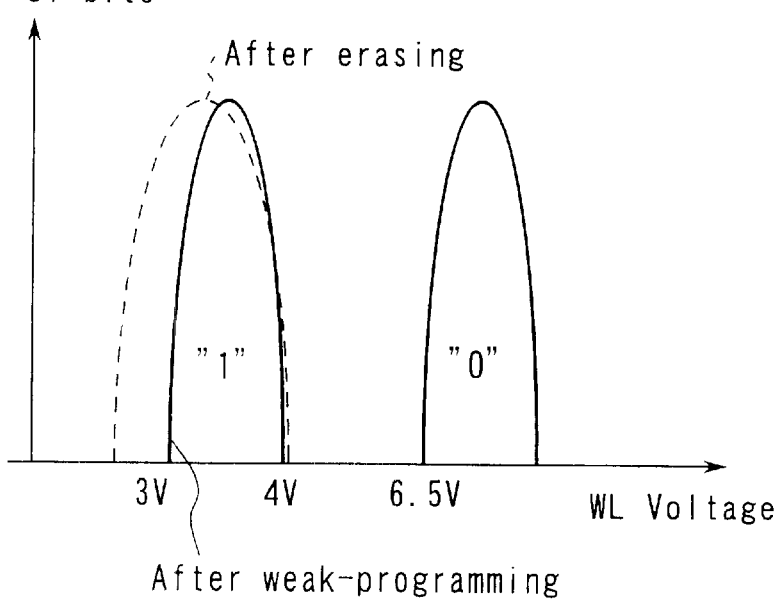
FIG. 18 is a diagram showing the state of distribution of the threshold voltage of the memory cell after data erasing.

The threshold voltage of the memory cell immediately after data erasing is widely distributed as shown by broken lines in FIG. 18, for example. If the threshold voltage is excessively lowered, a leak current flows in the bit line connected to the memory cell. In this case, if the memory cells other than the memory cell whose threshold voltage is excessively lowered are set in the programmed state ("0"), data is regarded as "1" as viewed from the sense amplifier when data of the memory cell set in the programmed state is read out and thus an erroneous operation is effected. In order to prevent this problem, a weak program process for slightly re-programming the memory cell set in the excessively erased state is effected. The weak program mode is a mode in which the weak program process is effected. Low word line voltage is supplied to a memory cell in which data becomes "1" by the excessive erase verify process to raise the threshold voltage thereof. The excessive verify process and weak program process are repeatedly effected until the satisfactory excessive erase verify process is effected. At this time, in order to reduce time for the weak program process, the word line voltage is raised by 0.5V each time the weak program process is effected. Then, if the excessive erase verify process is satisfactorily effected for all of the memory cells in the block subjected to the erase process, the weak program operation is terminated.

Figure 19:
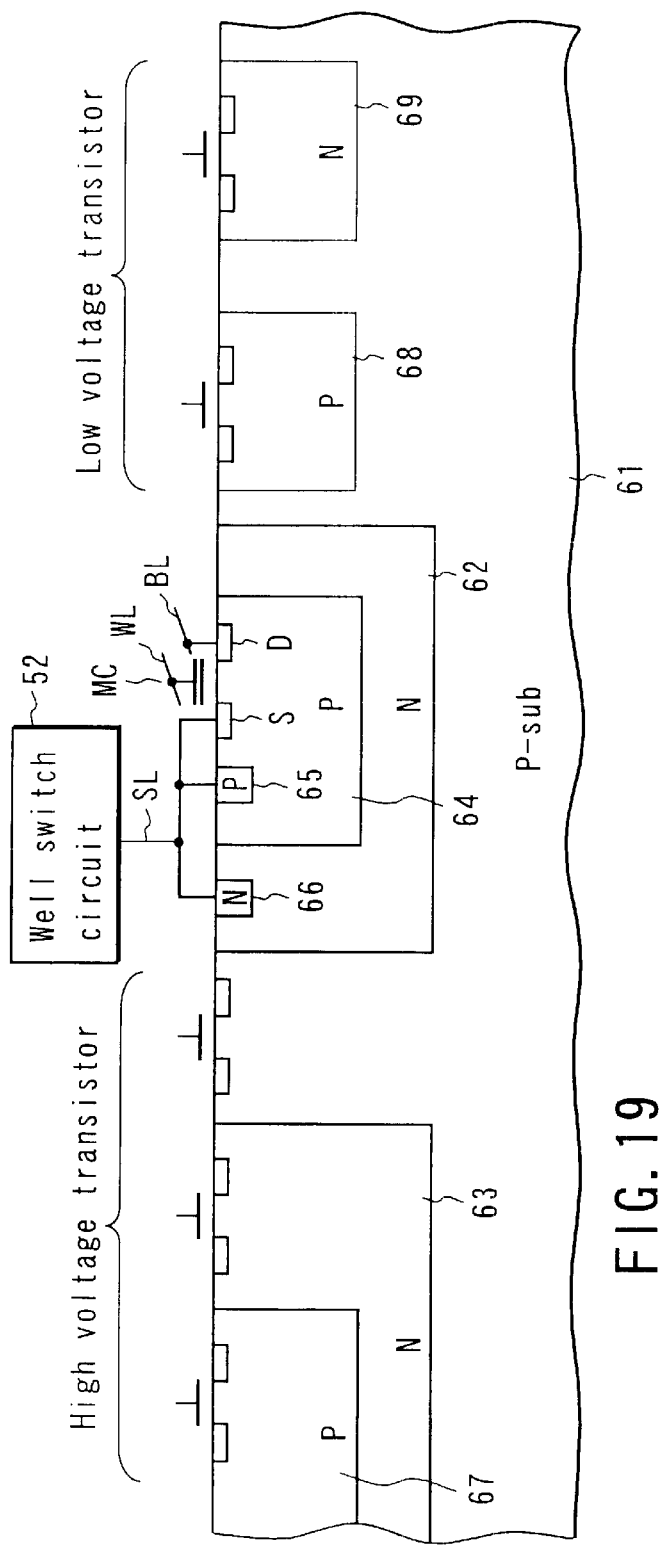
FIG. 19 is a cross sectional view showing the structure of part of the flash memory shown in FIG. 16.

FIG. 19 is a cross sectional view showing the construction of part of the flash memory of FIG. 16. N-type well regions 62, 63 are formed in a P-type semiconductor substrate 61. A P-type well region 64 is formed in the N-type well region 62. The memory cells MC in the memory cell array 46 shown in FIG. 16 are formed in the P-type well region 64. In FIG. 19, only one of the memory cells MC is shown for brevity of the drawing.

A P-type contact region 65 acting as a contact region of the well region 64 is formed in the P-type well region 64 and an N-type contact region 66 acting as a contact region of the well region 62 is formed in the N-type well region 62. The contact regions 65, 66 are connected to the source line SL together with the sources of the memory cells MC and the voltage generated from the well switch circuit 52 is commonly supplied to the well regions 62, 64 and the sources of the memory cells MC via the source line SL. The drain D of the memory cell MC is connected to a corresponding one of a plurality of bit lines BL.

The memory cell MC has no overlap area between the floating gate electrode and the source S.

In the N-type well region 63, a P-type well region 67 is formed and N-channel and P-channel MOS transistors of a peripheral circuit which is applied with high voltage in the flash memory and requires high breakdown voltage (HV) are formed in the semiconductor substrate 61, P-type well region 67 and N-type well region 63.

Further, in the P-type semiconductor substrate 61, a P-type well region 68 and N-type well region 69 are formed. N-channel and P-channel MOS transistors of a peripheral circuit of low breakdown voltage (LV) which does not require high breakdown voltage in the flash memory are formed in the P-type and N-type well regions 68, 69.

The transistors shown in FIG. 19 are only part of transistors and a large number of transistors are actually formed on the semiconductor substrate 61.

The readout operation for the flash memory with the above construction is effected by selecting one word line WL and applying a voltage of 5V, for example, to the selected word line WL. At this time, a voltage of 0V is output from the well switch circuit 52 and the voltage of 0V is applied to the P-type well region 64 in which the memory cells are formed via the source line SL. Further, since the sources of the memory cells MC are connected to the well region 64, the sources of the memory cells MC are also set at 0V.

On the other hand, preset voltage is applied to the bit line BL of the memory cell. At this time, since the threshold voltage of the memory cell as viewed from the word line WL is 5V or less when the selected cell is a "1" cell, a drain current flows in the memory cell. In the case of "0" cell, since the threshold voltage of the memory cell as viewed from the word line WL is 5V or more, a drain current does not flow in the memory cell. The current is sensed and amplified by the sense amplifier and sense data is output to the exterior.

Like the case of the readout operation, in the program operation, a voltage of 7V to 10V is applied to the word line WL while it is stepped up by 0.5V at one time. At this time, a voltage of 0V is output from the well switch circuit 52.

At this time, a voltage of 5V is applied to the bit line BL according to program data. Therefore, a current flows in the drain-source path of the selected cell and hot electrons generated at this time are injected into the floating gate to raise the threshold voltage of the cell to 5V or more and thus the program operation is effected. Since a voltage of 0V is applied to the program non-selection bit lines BL and no hot electrons are generated, the threshold voltage is kept at 5V or less.

Figure 20:
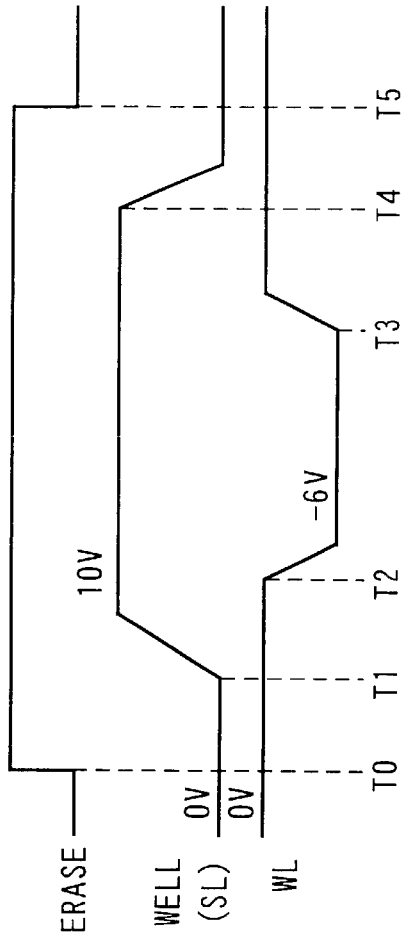
FIG. 20 is a timing chart at the time of erase operation of the flash memory shown in FIG. 16.

Next, the erase operation is explained with reference to the timing chart of FIG. 20. First, an erase signal ERASE is set to the "H" level at timing t0. At timing T1 after the timing T0, a voltage of 10V is output from the well switch circuit 52 so as to start to charge the well region 64 via the source line SL. At this time, the rising slope of the voltage of 10V is made relatively gentle.

After the well region 64 is charged to 10V, a voltage of −6V is output from the row decoder at timing T2 so as to start to charge the word line WL by the voltage of −6V.

Then, the erasing process is effected when the well region 64 is set at 10V and the word line WL is set at −6V. That is, when the word line WL is set at −6V, the floating gate electrode is set at preset negative voltage whose absolute value is smaller than that of −6V by the capacitive coupling between the control gate electrode and the floating gate electrode. At this time, a tunnel current flows between the floating gate electrode and the whole portion of the channel region of the memory cell to extract electrons from the floating gate electrode, thereby lowering the threshold voltage of the memory cell to 5V or less. Thus, the erase operation is effected.

After the erase process is terminated, a voltage of 0V is output from the row decoder at timing T3 to reset the word line WL to 0V. It is also required to slowly effect the reset operation. This is because the well voltage is excessively raised by the capacitive coupling between the word line and the well region and breakdown of the well region or junction breakdown occurs if the word line WL is abruptly reset to 0V.

After this, the well region is rest to 0V at timing T4. It is also required to slowly effect the reset operation. This is because the word line potential is made negative by the capacitive coupling between word line and the well region and becomes lower than the well potential (0V) of the N-type MOS transistor constructing the row decoder to cause the resultant forward bias state if the reset operation is effected at excessively high speed.

After this, the erase signal ERASE is set at the "L" level at timing T5 to complete the erase operation.

Thus, the data erasing operation is effected by causing a tunnel current to flow in the whole portion of the channel region. Further, since an overlap area between the floating gate electrode and the source is not formed, the reduction rate of the memory cell size can be enhanced.

As shown in FIG. 19, the P-type well region 64 in which the memory cells MC are formed and the N-type well region 62 in which the P-type well region 64 is formed are both connected to the source line SL. Since the well region 64 and the source S of the memory cell are both set at 0V at the program time and readout time, the well region 64 and the source S can be short-circuited. Further, at the erase time, the well region 64 and the source S can be biased to the same potential and they may be short-circuited. Thus, since it is not necessary to separately form the well interconnection and the source interconnection, the interconnection area and the drive circuit for the interconnections can be reduced.

Further, the following table 3 indicates the relation between the various operation modes of the memory cell of FIG. 19 and the voltages of the selected WL, non-selected WL, selected BL (bit line), non-selected BL, selected source line and non-selected source line. In this example, voltage is applied to the selected WL at the erase time in a range of −5V to −7.5V while it is stepped up by 0.5V at one time.

TABLE 3

| Operation mode | Selected WL | Non-selected WL | Selected BL | Non-selected BL | Selected source line | Non-selected source line |
|---|---|---|---|---|---|---|
| Readout | 5 V | 0 V | 1 V | Floating | 0 V | 0 V |
| Program | 7–10 V (0.5 V step up) | 0 V | 5 V | Floating | 0 V | 0 V |
| Program verify | 6.5 V | 0 V | 1 V | Floating | 0 V | 0 V |
| Erase | −5 V to 7.5 V (0.5 V step up) | 0 V | Floating | Floating | 10 V | 10 V |
| Erase verify | 4 V | −1 V | 1 V | Floating | 0 V | 0 V |
| Excessive erase verify | 2.5 V | −1 V | 1 V | Floating | 0 V | 0 V |
| Weak program | 2.5 V to 5 V (0.5 V step up | −1 V | 1 V | Floating | 0 V | 0 V |

As described above, according to this invention, a semiconductor device can be provided in which the number of booster circuits can be reduced to suppress an increase in the chip area at the time of integration and the consumption current can be suppressed to a small value since voltage having variously changing values is generated from the regulator circuit by using an output of the booster circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including a plurality of data-erasable memory cells including gate electrodes, for storing data;
   a plurality of word lines coupled with the gate electrodes of said plurality of memory cells;
   a first voltage output circuit supplied with a first voltage, for outputting a second voltage obtained by boosting the first voltage;
   a second voltage output circuit coupled with said first voltage output circuit, for generating a third voltage whose voltage value is smaller than a value of the second voltage and which is variably set to at least two values based on the second voltage;
   an equalizer circuit coupled with said first and second voltage output circuits, for short-circuiting an output node of the second voltage and an output node of the third voltage in response to a first control signal; and
   a row decoder circuit coupled with said second voltage output circuit, for setting potentials of said plurality of word lines based on the third voltage.

2. The semiconductor memory device according to claim 1, wherein an operation period of said second voltage output circuit and a short-circuiting operation period of said equalizer circuit do not overlap each other.

3. The semiconductor memory device according to claim 1, wherein said equalizer circuit starts an operation for short-circuiting the output node of the second voltage and the output node of the third voltage when a boosting operation is started by said first voltage output circuit, and terminates the short-circuiting operation after a predetermined period of time has elapsed after boosting operation was started.

4. The semiconductor memory device according to claim 1, wherein said equalizer circuit starts an operation for short-circuiting the output node of the second voltage and the output node of the third voltage when a boosting operation is started by said first voltage output circuit, and terminates the short-circuiting operation after the boosting operation was started and the second voltage reached a predetermined value.

5. The semiconductor memory device according to claim 1, further comprising a third voltage output circuit for generating a fourth voltage whose value is smaller than the second voltage, said third voltage output circuit being operated when said second voltage output circuit is not operated and outputting the fourth voltage to the output node of the second voltage.

6. The semiconductor memory device according to claim 1, wherein said first voltage output circuit includes
   a charge pump circuit supplied with an oscillation signal, for boosting the first voltage in synchronism with the oscillation signal and outputting the second voltage;
   a third voltage output circuit coupled with said charge pump circuit, for outputting a fourth voltage which varies in proportion to the second voltage and has a value smaller than the second voltage;

a voltage comparing circuit coupled with said third voltage output circuit, for comparing the fourth voltage with a fifth voltage used as a reference voltage, and outputting a second control signal based on a result of comparison; and an oscillation circuit coupled with said first voltage comparing circuit, for outputting the oscillation signal, an oscillation signal outputting operation of said oscillation circuit being controlled based on the second control signal.

7. The semiconductor memory device according to claim 1, wherein said equalizer circuit includes a transistor having first and second terminals and a gate electrode, the first terminal being coupled with the output node of the second voltage and the second terminal being coupled with the output node of the third voltage; and a level shift circuit supplied with the first control signal, for shifting one of voltage levels of the first control signal to the second voltage and then outputting a thus obtained first control signal to the gate electrode of said transistor.

8. The semiconductor memory device according to claim 1, wherein said second voltage output circuit includes a transistor having first and second terminals and a gate electrode, the first terminal being coupled with the output node of the second voltage and the second terminal being coupled with the output node of the third voltage;

a series circuit having a plurality of resistors serially connected between the output node of the third voltage and a node of ground voltage, for outputting a fourth voltage obtained by dividing the third voltage;

a circuit coupled with said series circuit, for changing a voltage division ratio of said series circuit;

a voltage comparing circuit for comparing the fourth voltage with a fifth voltage used as a reference voltage, and outputting a second control signal based on a result of comparison; and a control circuit coupled with said voltage comparing circuit, for controlling the gate electrode of said transistor according to the second control signal.

9. A semiconductor memory device comprising:

a memory cell array including a plurality of data-erasable memory cells including drain and source regions formed in a semiconductor region and gate electrodes, for storing data;

a first voltage supply circuit for outputting a first voltage to the drain of said memory cell at a data program time;

a first voltage output circuit supplied with a second voltage, for outputting the first voltage obtained by boosting the second voltage, supplying the first voltage to said first voltage supply circuit and outputting a third voltage obtained by boosting the second voltage;

a second voltage output circuit coupled with said first voltage output circuit, for generating a fourth voltage whose voltage value is smaller than a value of the third voltage and which is variably set to at least two values based on the third voltage;

an equalizer circuit coupled with said first and second voltage output circuits, for short-circuiting an output node of the third voltage and an output node of the fourth voltage in response to a first control signal; and a second voltage supply circuit coupled with said second voltage output circuit, for supplying the fourth voltage to the gate electrode of said memory cell at the data program time.

10. The semiconductor memory device according to claim 9, further comprising a third voltage output circuit coupled with said first voltage output circuit, said third voltage output circuit supplied with the third voltage, for outputting the third voltage to said source regions of said plurality of data-erasable memory cells in response to a second control signal.

11. The semiconductor memory device according to claim 9, wherein said first voltage output circuit includes a charge pump circuit supplied with an oscillation signal, for boosting the second voltage in synchronism with the oscillation signal and outputting the third voltage;

a third voltage output circuit coupled with said charge pump circuit, for outputting a fifth voltage which varies in proportion to the third voltage and has a value smaller than the third voltage;

a voltage comparing circuit coupled with said third voltage output circuit, for comparing the fifth voltage with a sixth voltage used as a reference voltage, and outputting a second control signal based on a result of comparison; and an oscillation circuit coupled with said voltage comparing circuit, for outputting the oscillation signal, as oscillation signal outputting operation of said oscillation circuit being controlled based on the second control signal.

12. The semiconductor memory device according to claim 9, wherein said equalizer circuit includes a transistor having first and second terminals and a gate electrode, the first terminal being coupled with the output node of the third voltage and the second terminal being coupled with the output node of the fourth voltage; and a level shift circuit supplied with the first control signal, for shifting one of voltage levels of the first control signal to the third voltage and then outputting a thus obtained first control signal to the gate electrode of said transistor.

13. The semiconductor memory device according to claim 9, wherein said second voltage output circuit includes a transistor having first and second terminals and a gate electrode, the first terminal being coupled with the output node of the third voltage and the second terminal being coupled with the output node of the fourth voltage;

a series circuit having a plurality of resistors serially connected between the output node of the fourth voltage and a node of ground voltage, for outputting a fifth voltage obtained by dividing the fourth voltage;

a circuit coupled with said series circuit, for changing a voltage division ratio of said series circuit;

a voltage comparing circuit for comparing the fifth voltage with a seventh voltage used as a reference voltage, and outputting a fourth control signal based on a result of comparison; and a control circuit coupled with said voltage comparing circuit, for controlling the gate electrode of said transistor according to the fourth control signal.

14. A semiconductor memory device comprising:

a memory cell array including a plurality of data-erasable memory cells including drain and source regions formed in a semiconductor region and gate electrodes, for storing data;

a plurality of word lines coupled with the gate electrodes of said plurality of memory cells;

a first voltage supply circuit for outputting a first voltage to a drain of a selected one of said memory cells at a data program time;

a first voltage output circuit supplied with a second voltage, for outputting the first voltage obtained by boosting the second voltage, supplying the first voltage to said first voltage supply circuit and outputting a third voltage obtained by boosting the second voltage;

a second voltage output circuit coupled with said first voltage output circuit, for generating a fourth voltage whose voltage value is smaller than a value of the third voltage and which is variably set to at least two values based on the third voltage;

an equalizer circuit coupled with said first and second voltage output circuits, for short-circuiting an output node of the third voltage and an output node of the fourth voltage in response to a first control signal; and a row decoder circuit coupled with said second voltage output circuit, for supplying the fourth voltage to a selected one of said word lines at a data program time.

15. The semiconductor memory device according to claim 14, wherein said first voltage output circuit includes a charge pump circuit supplied with an oscillation signal, for boosting the second voltage in synchronism with the oscillation signal and outputting the third voltage;

a third voltage output circuit coupled with said charge pump circuit, for outputting a fifth voltage which varies in proportion to the third voltage and has a value smaller than the third voltage;

a voltage comparing circuit coupled with said third voltage output circuit, for comparing the fifth voltage with a sixth voltage used as a reference voltage, and outputting a second control signal based on a result of comparison and an oscillation circuit coupled with said voltage comparing circuit, for outputting the oscillation signal, an oscillation operation of said oscillation circuit being controlled based on the second control signal.

16. The semiconductor memory device according to claim 14, wherein said equalizer circuit includes a transistor having first and second terminals and a gate electrode, the first terminal being coupled with the output node of the third voltage and the second terminal being coupled with the output node of the fourth voltage; and a level shift circuit supplied with the first control signal, for shifting one of voltage levels of the first control signal to the third voltage and then outputting a thus obtained first control signal to the gate electrode of said transistor.

17. The semiconductor memory device according to claim 14, wherein said second voltage output circuit includes a transistor having first and second terminals and a gate electrode, the first terminal being coupled with the output node of the third voltage and the second terminal being coupled with the output node of the fourth voltage;

a series circuit having a plurality of resistors serially connected between the output node of the fourth voltage and a node of ground voltage, for outputting a fifth voltage obtained by dividing the fourth voltage; a circuit coupled with said series circuit, for changing a voltage division ratio of said series circuit;

a voltage comparing circuit for comparing the fifth voltage with a sixth voltage used as a reference and outputting a third control signal based on a result of comparison; and a control circuit coupled with said voltage comparing circuit, for controlling the gate electrode of said transistor according to the third control signal.

18. A semiconductor memory device comprising:

a memory cell array including a plurality of data-erasable memory cells including drain and source regions formed in a semiconductor region and gate electrodes, for storing data;

a first voltage output circuit supplied with a first voltage, for outputting a second voltage obtained by boosting the first voltage;

a second voltage output circuit coupled with said first voltage output circuit, for generating a third voltage whose voltage value is smaller than a value of the second voltage and which is variably set to at least two values based on the second voltage;

a row decoder circuit coupled with said second voltage output circuit, for supplying the third voltage to a selected one of said gate electrodes at a data program time; and a switch circuit coupled with said first voltage output circuit, for supplying the second voltage to at least one of said source regions at a data erase time.

19. The semiconductor memory device according to claim 18, which further comprises a third voltage output circuit coupled with said row decoder circuit, for outputting a fourth voltage to said row decoder circuit, and wherein said row decoder circuit outputs said fourth voltage to at least one of gate electrodes of said memory cells at the data erase time.

* * * * *